United States Patent
Ali et al.

(10) Patent No.: US 11,068,345 B2
(45) Date of Patent: Jul. 20, 2021

(54) METHOD AND SYSTEM FOR ERASURE CODED DATA PLACEMENT IN A LINKED NODE SYSTEM

(71) Applicant: Dell Products L.P., Hopkinton, MA (US)

(72) Inventors: Rizwan Ali, Cedar Park, TX (US); Dharmesh M. Patel, Round Rock, TX (US); Arvind Ramakrishnan Palamadai, Bangalore (IN); Ravikanth Chaganti, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 16 days.

(21) Appl. No.: 16/587,399

(22) Filed: Sep. 30, 2019

(65) Prior Publication Data

US 2021/0096952 A1 Apr. 1, 2021

(51) Int. Cl.
  *G06F 3/06* (2006.01)
  *G06F 11/10* (2006.01)
  *H03M 13/15* (2006.01)

(52) U.S. Cl.
  CPC .......... *G06F 11/1076* (2013.01); *G06F 3/067* (2013.01); *G06F 3/0689* (2013.01); *H03M 13/154* (2013.01)

(58) Field of Classification Search
  CPC ............................ G06F 3/067; G06F 3/0689
  See application file for complete search history.

(56) References Cited

U.S. PATENT DOCUMENTS

| | | | |
|---|---|---|---|
| 8,972,478 B1* | 3/2015 | Storer | G06F 3/0689 |
| | | | 709/201 |
| 9,916,200 B2 | 3/2018 | Xu | |
| 10,437,691 B1* | 10/2019 | Barhate | G06F 11/0754 |
| 10,592,337 B1* | 3/2020 | Banerjee | G06F 3/0644 |
| 2006/0041580 A1 | 2/2006 | Ozdemir et al. | |
| 2013/0246704 A1 | 9/2013 | Kotzur | |
| 2016/0085467 A1 | 3/2016 | Saxena et al. | |
| 2018/0039441 A1 | 2/2018 | Nimura et al. | |
| 2018/0048333 A1* | 2/2018 | Nilsson | H03M 13/2942 |
| 2018/0217898 A1* | 8/2018 | Tormasov | G06Q 20/42 |
| 2018/0307560 A1* | 10/2018 | Vishnumolakala | G06F 3/065 |
| 2019/0044853 A1* | 2/2019 | Raghunath | G06F 3/0658 |
| 2020/0241781 A1* | 7/2020 | Patel | G06F 3/067 |

OTHER PUBLICATIONS

"Failover behavior on clusters of three or more nodes", dated Apr. 20, 2018, retrieved at https://support.microsoft.com/en-us/help/299631/failover-behavior-on-clusters-of-three-or-more-nodes. (4 pages).

* cited by examiner

*Primary Examiner* — Joseph D Torres
(74) *Attorney, Agent, or Firm* — Chamberlain, Hrdlicka, White, Williams & Aughtry

(57) ABSTRACT

In general, embodiments of the invention relate to storing data and managing the stored data in linked nodes. More specifically, embodiments of the invention relate to nodes linked together in a daisy chain configuration such as, but not limited to, a single-chain configuration and a dual-chain configuration, which use data protection domain (DPD) information to determine where and/or how to store the data.

17 Claims, 20 Drawing Sheets

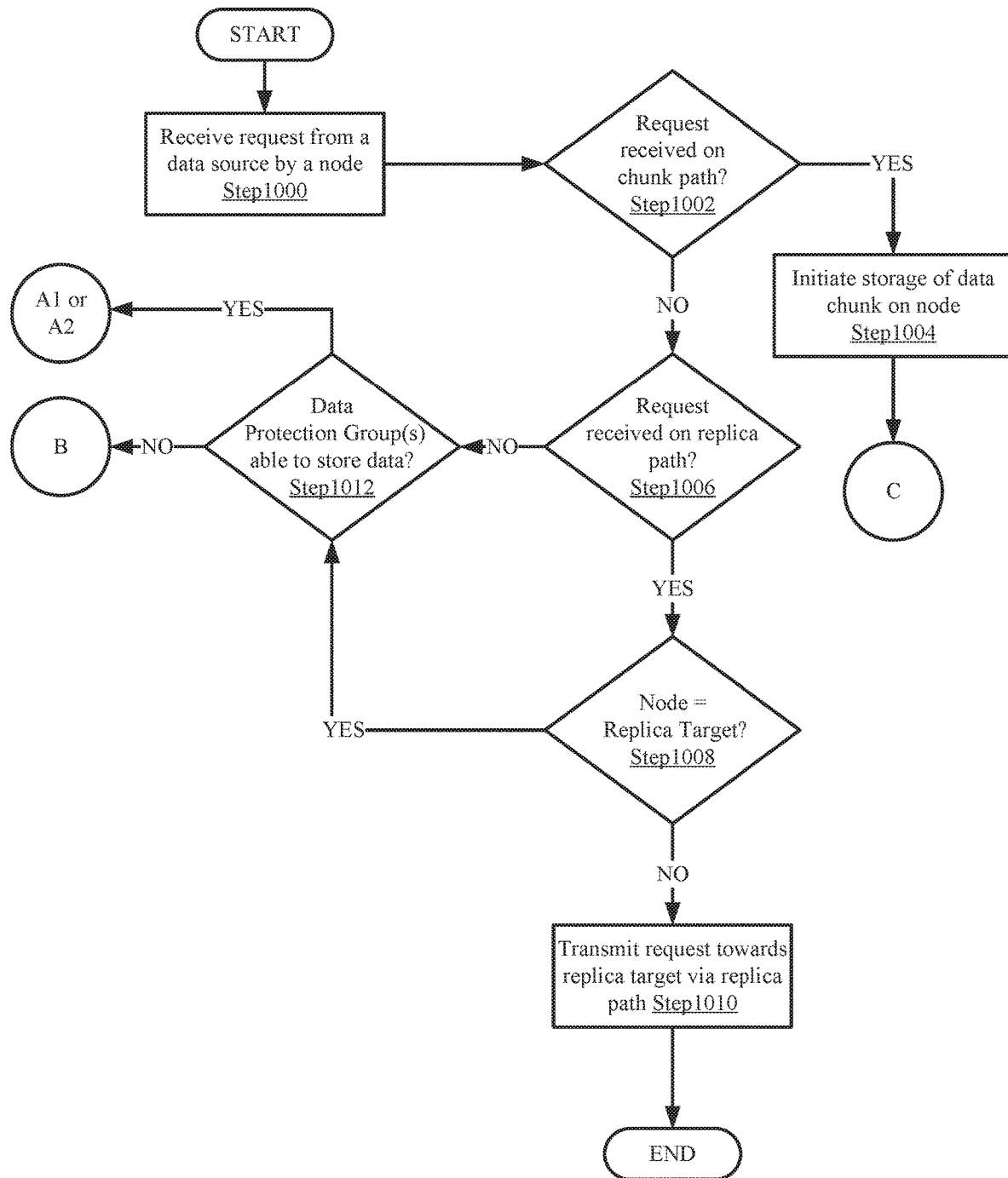
FIG. 10.1

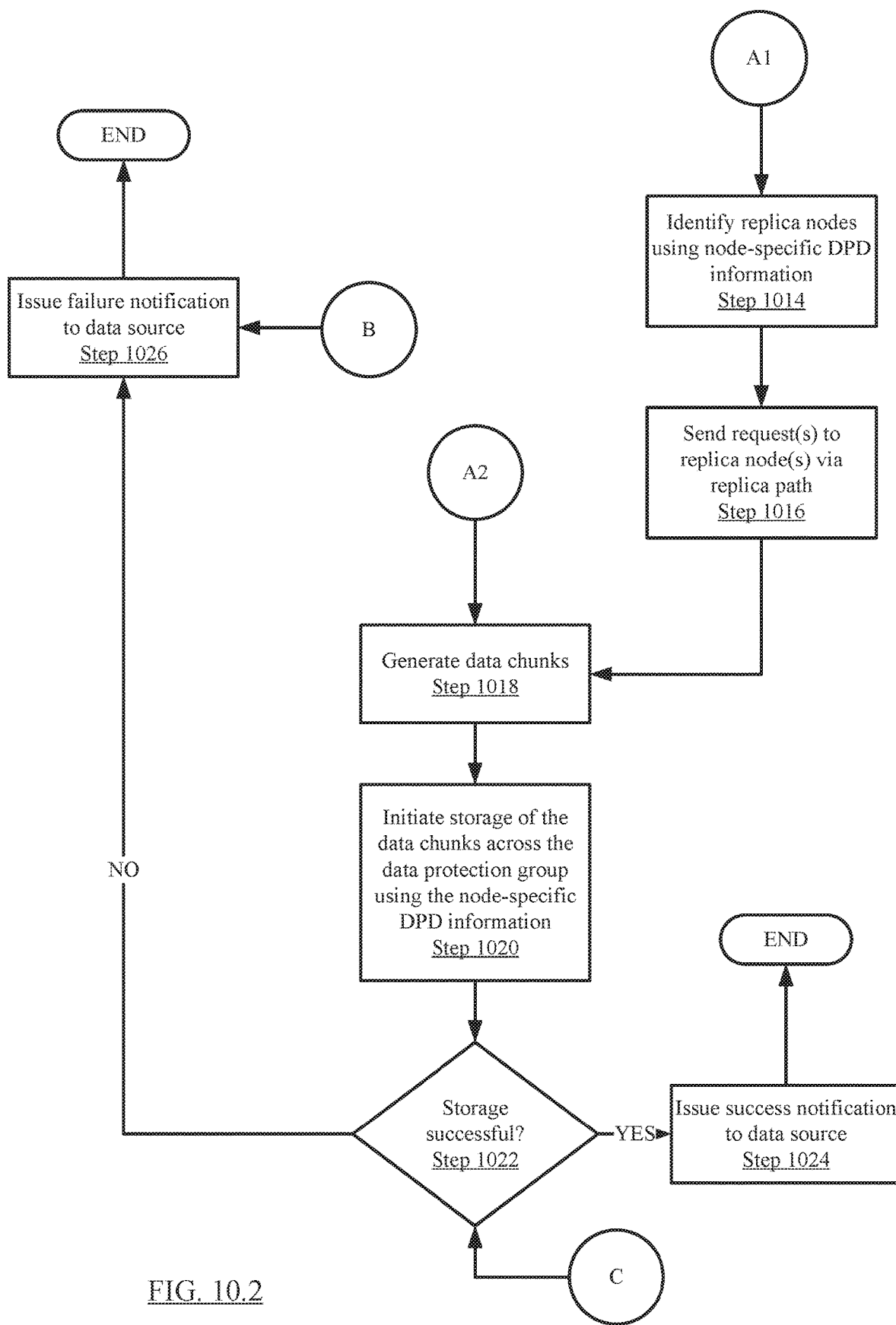
FIG. 10.2

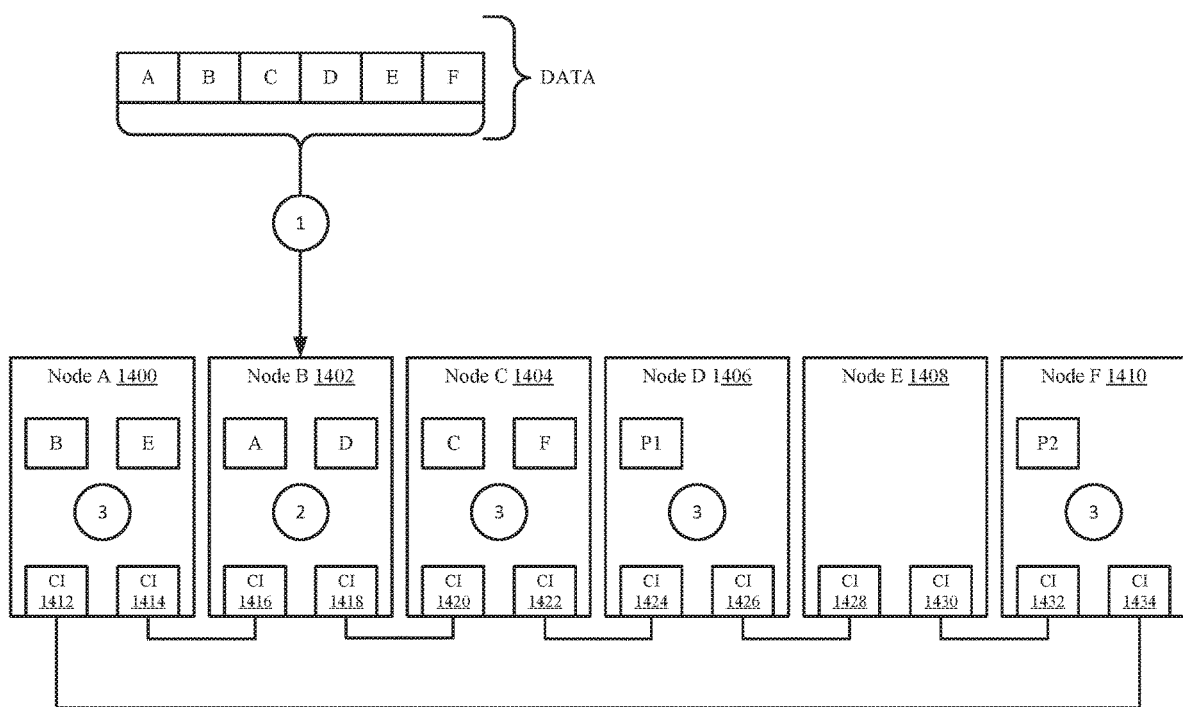
FIG. 14.1

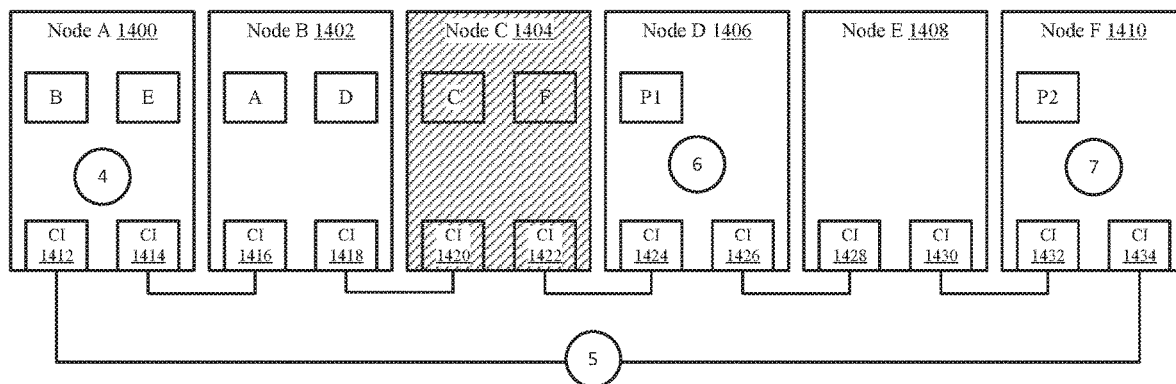
FIG. 14.2
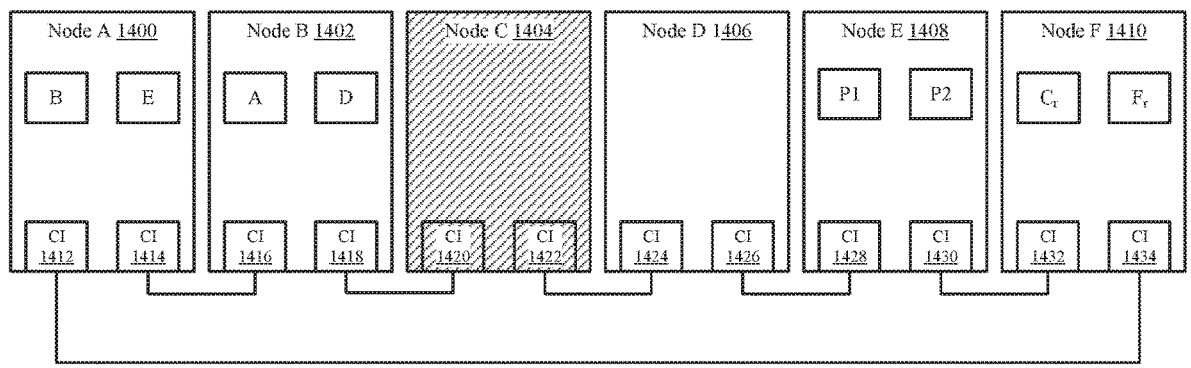
FIG. 14.3

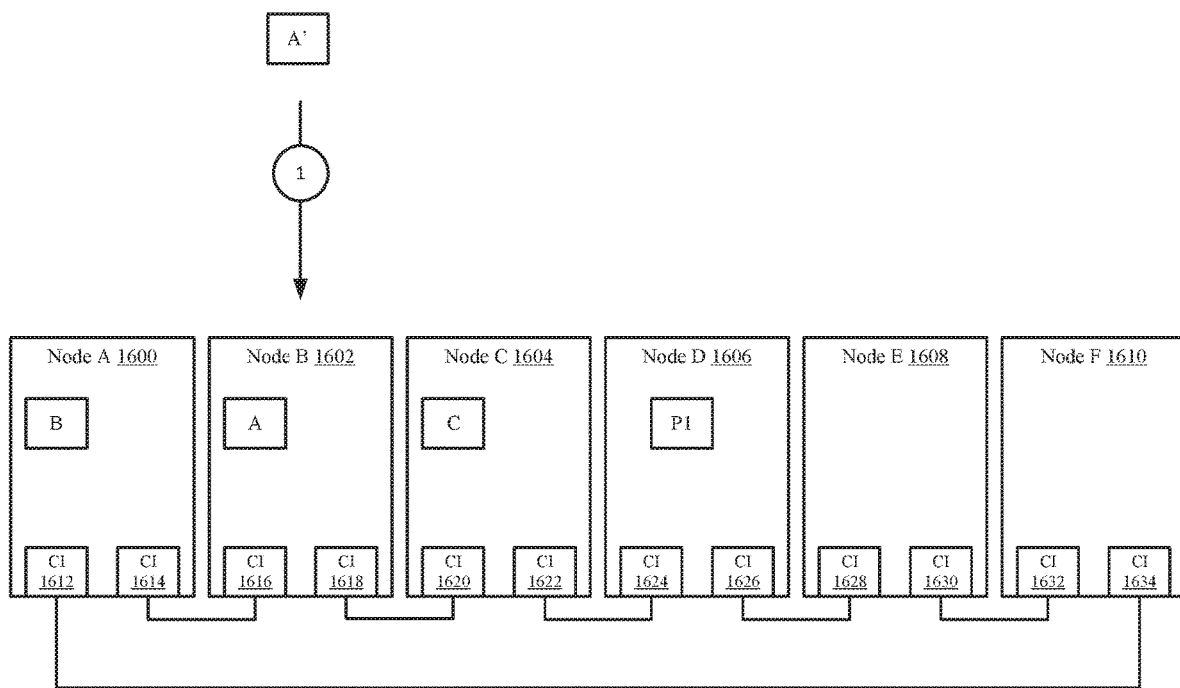
FIG. 16.1

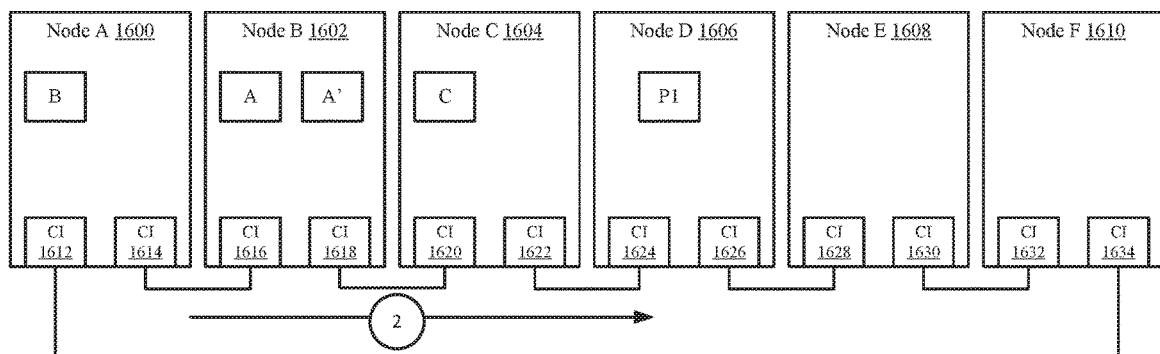
FIG. 16.2
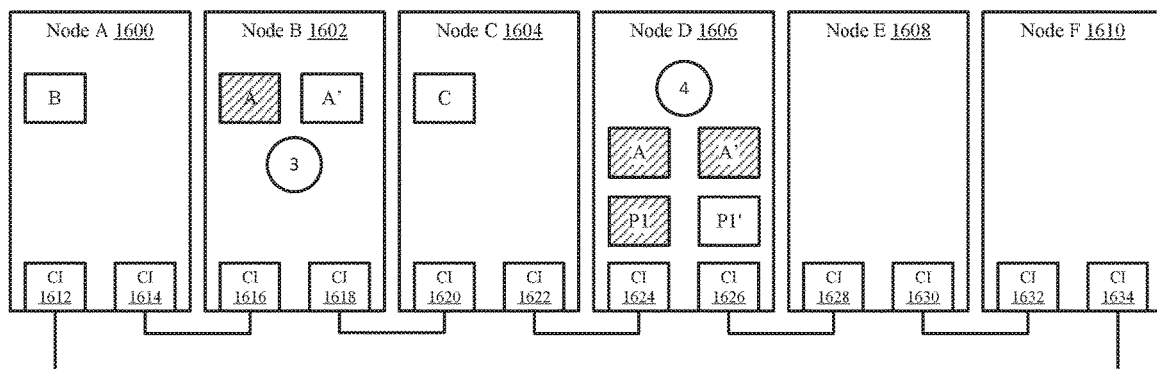
FIG. 16.3

METHOD AND SYSTEM FOR ERASURE CODED DATA PLACEMENT IN A LINKED NODE SYSTEM

BACKGROUND

Computing devices may generate data during their operation. For example, applications hosted by the computing devices may generate data used by the applications to perform their functions. Such data may be stored in persistent storage of the computing devices. Failure of the persistent storage may result in data loss.

SUMMARY

In general, in one aspect, the invention relates to a method for storing data. The method includes receiving, by a node, a request to store data from a data source, dividing the data into a plurality of data chunks and generating a parity chunk using the plurality of data chunks based on an erasure coding scheme, and storing the plurality of data chunks and the parity chunk across a plurality of nodes using data protection domain (DPD) information, wherein the node is one of the plurality of nodes.

In general, in one aspect, the invention relates to a non-transitory computer readable medium comprising computer readable program code, which when executed by a computer processor enables the computer processor to perform a method for storing data, a method comprising: receiving, by a node, a request to store data from a data source, dividing the data into a plurality of data chunks and generating a parity chunk using the plurality of data chunks based on an erasure coding scheme, and storing the plurality of data chunks and the parity chunk across a plurality of nodes using data protection domain (DPD) information, wherein the node is one of the plurality of nodes.

In general, in one aspect, the invention relates to a node, comprising a processor, memory, comprising data protection domain (DPD) information; and instructions which when executed by the processor, enable the node to perform a method. The method comprising receiving a request to store data from a data source, dividing the data into a plurality of data chunks and generating a parity chunk using the plurality of data chunks based on an erasure coding scheme and storing the plurality of data chunks and the parity chunk across a plurality of nodes using the DPD information, wherein the node is one of the plurality of nodes.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIGS. 10.1-10.2 show flowcharts of a method of storing data in nodes in accordance with one or more embodiments of the invention.

FIGS. 14.1-14.3 show diagrams of an example of storing data and rebuilding data in nodes in accordance with one or more embodiments of the invention.

FIGS. 16.1-16.3 show diagrams of an example of storing data in nodes in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to storing data (e.g., a file(s), a block(s), a blob(s), etc.) and managing the stored data in linked nodes. More specifically, embodiments of the invention relate to nodes linked together in a daisy chain configuration such as, but not limited to, a single-chain configuration and a dual-chain configuration, which use data protection domain (DPD) information to determine where and/or how to store the data. The nodes include functionality to generate the DPD information by discovering to which other nodes they are connected. The DPD information may then be used to enable data protection of the data stored in the linked nodes. For example, the data protection may take the form of replication (e.g., multiple copies of the data may be stored across different nodes) or the form of erasure coding (e.g., data protection using one or more parity values). In addition, the nodes may include functionality to dynamically update the DPD information based on state changes of the various nodes (e.g., one or more nodes become unreachable or a new node is added to the cluster). As a result, the nodes are able to dynamically adjust where and/or how data is stored across the nodes using the updated DPD information.

Figure 1:
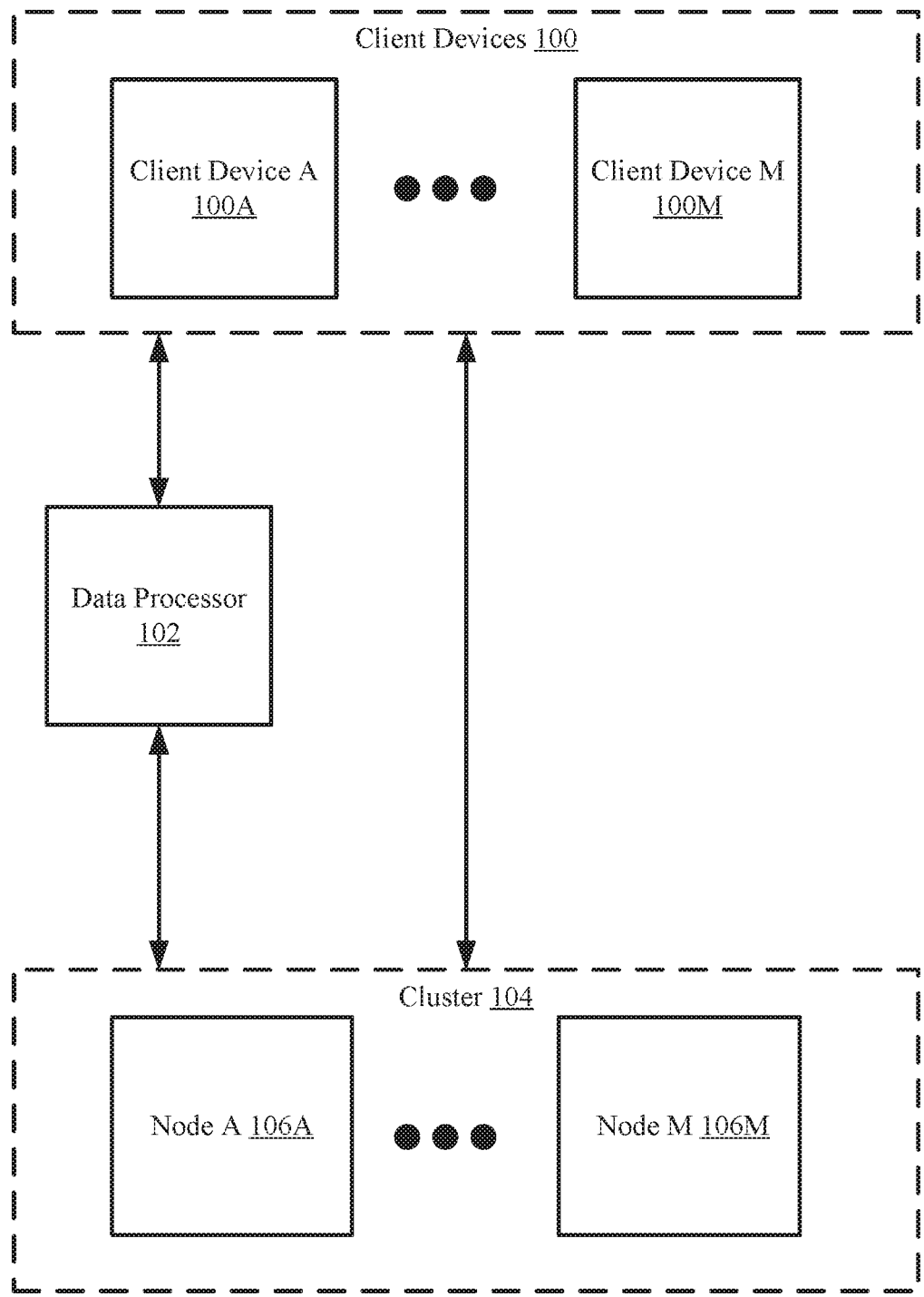
FIG. 1 shows a diagram of a system in accordance with one or more embodiments of the invention.

FIG. 1 shows a diagram of a system in accordance with one or more embodiments of the invention. The system includes one or more client devices (100A, 100M), a data processor (102), and a cluster (104). The components of the system of FIG. 1 may be operably connected to each other (and/or other components) via any combination of wired and/or wireless networks. Each component of the system of FIG. 1 is discussed below.

The client devices (100) may be implemented using computing devices. The computing devices may be, for example, mobile phones, tablet computers, laptop computers, desktop computers, servers, or cloud resources. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to perform the functions described in this application. The client devices (100) may be implemented using other types of computing devices without departing from the invention. For additional details regarding computing devices, see e.g., FIG. 17.

The client devices (100) may be implemented using logical devices without departing from the invention. For example, the client devices (100) may be implemented using virtual machines that utilize computing resources of any number of physical computing devices (see e.g., FIG. 17) to provide their respective functionalities. The client devices (100) may be implemented using other types of logical devices without departing from the invention.

In one or more embodiments of the invention, the client devices (100) include functionality to issue request (e.g., read and write requests) to the data processor (102) and/or directly to cluster (104) (or, more specifically, the one or more nodes in the cluster).

The data processor (102) may be implemented using computing devices. The computing devices may be, for example, mobile phones, tablet computers, laptop computers, desktop computers, servers, or cloud resources. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to perform the functions described in this application. The data processor (102) may be implemented using other types of computing devices without departing from the invention. For additional details regarding computing devices, see e.g., FIG. 17.

The data processor (102) may be implemented using logical devices without departing from the invention. For example, the data processor (102) may be implemented using virtual machines that utilize computing resources of any number of physical computing devices (see e.g., FIG. 17) to provide their respective functionalities. The data processor (102) may be implemented using other types of logical devices without departing from the invention.

In one or more embodiments of the invention, the data processor (102) includes functionality to receive requests from the clients and then send corresponding requests to the cluster (104). Additionally, or alternatively, the data processor, may also include functionality to issues its own requests (e.g., read and/or write requests) to the cluster. The data processor (102) may also include functionality to obtain DPD information from the various nodes in the cluster (also referred to as node-specific DPD information) and then combine the aforementioned DPD information to generate aggregated DPD information (discussed below). The data processor (102) may then use the aggregated DPD information to: (i) determine in which nodes to store copies of data (see e.g., FIGS. 8-9) and (ii) facilitate the storage of updated data chunks, which are protected using erasure coding, in a manner that minimizes the transmission of various associated data chunks and parity chunks between the nodes (see e.g., FIGS. 15-16.3).

In one or more embodiments of the invention, the nodes, using the node-specific DPD information (described below), are able to store data without the requirement of a data processor (102) to manage the storage processor. See e.g., FIGS. 6, 7, and 10-14C. In such scenarios, the data processor's (102) role may be limited to facilitating the communication of requests and corresponding responses from between the client devices (100) and the cluster (104).

The cluster (104) includes multiple nodes (106A, 106M). Each node in the cluster (104) is physically connected to at least two other nodes in the cluster (104). The number of nodes to which a given node is physically connected may vary based on the specific configuration of the nodes. For example, if the nodes are connected in a single-chain configuration (see e.g., FIG. 3), then each node is connected to two other nodes. However, if the nodes are connected in a dual-chain configuration (see e.g., FIG. 4), then each node may be connected to up to four other nodes. The specific number of connections that each node has to other nodes (regardless of configuration) may vary based on the number of nodes in the cluster and/or with the number of communication interfaces on each of the nodes. The nodes may be connected using other configurations without departing from the invention. The nodes (106A, 106M) include functionality to perform the functions described in this application and/or all, or a portion, of the methods or examples illustrated in FIGS. 5-16.3. Additional detail about the nodes is provided below in FIG. 2.

While the system of FIG. 1 has been illustrated and described as including a limited number of specific components, a system in accordance with one or more embodiments of the invention may include additional, fewer, and/or different components without departing from the invention.

Figure 2:
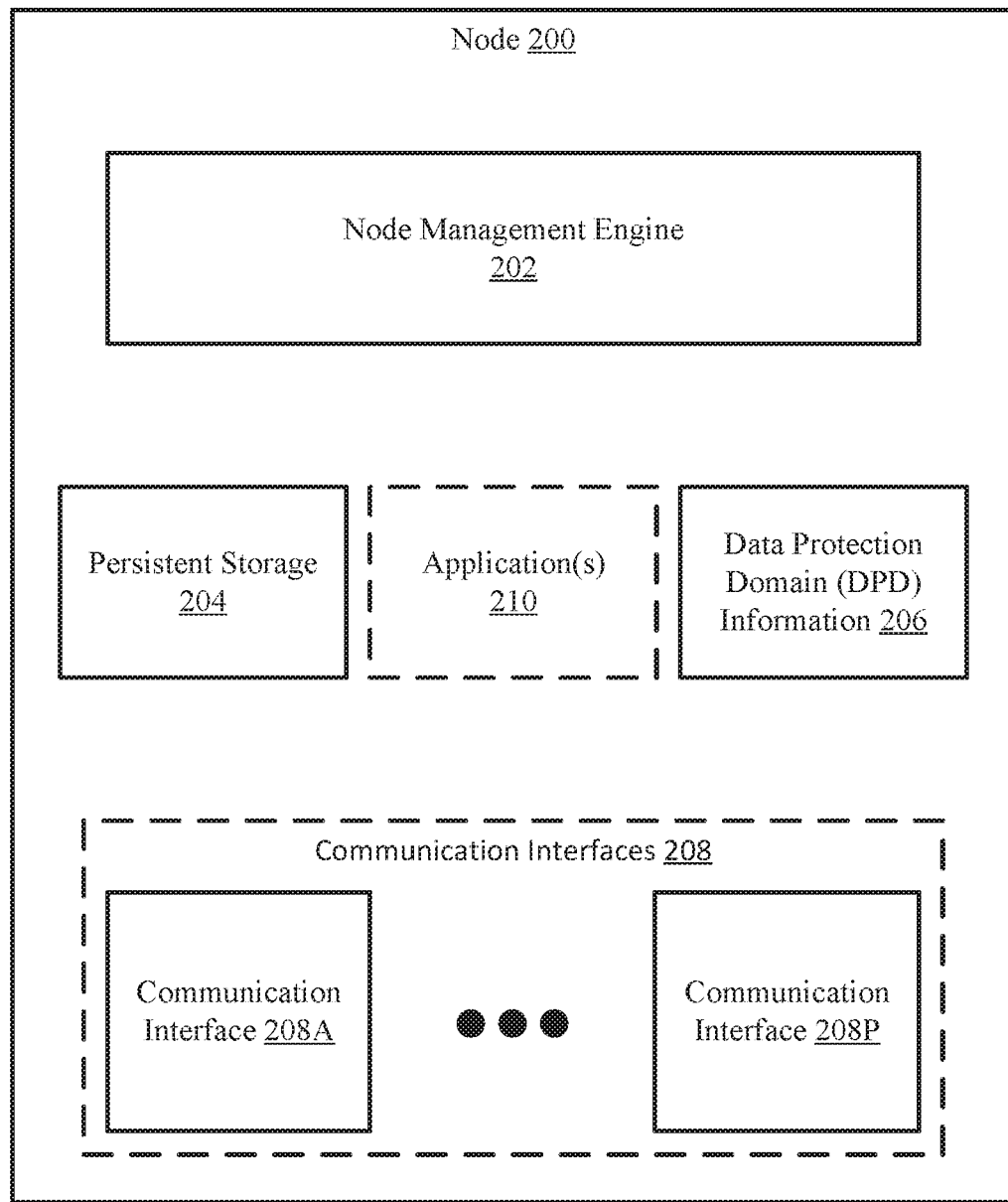
FIG. 2 shows a diagram of a node in accordance with one or more embodiments of the invention.

FIG. 2 shows a diagram of a node in accordance with one or more embodiments of the invention. The node (200) includes one or more processors (not shown), memory (e.g., random access memory (not shown)), a node management engine (202), persistent storage (204), data protection domain (DPD) information (206), communication interfaces (208), and optionally one or more applications (210). Each of these components is described below.

The node management engine (202) includes functionality to: (i) generate and maintain the node-specific DPD information (see e.g., FIGS. 5-6) and (ii) process requests received from client devices (100), the data processor (102), from one or more applications (210), and/or from one or more other nodes to which it is connected (see e.g., FIGS. 5-16.3).

In one embodiment of the invention, the node may include instructions, stored on the persistent storage (described below), that when executed by the processor(s) of the node cause the node to perform the functionality of the node management engine (202) described throughout this application and/or all, or a portion thereof, of the methods illustrated in FIGS. 5-16.3.

In one embodiment of the invention, the node management engine (202) may be implemented using special purpose hardware devices such as, for example, programmable gate arrays, application specific integrated circuits, or another type of hardware device that provides the functionality of the node management engine by including circuitry adapted to provide the aforementioned functionality. In another embodiment of the invention, the node management engine may be implemented using a combination of computer readable instructions (e.g., program code) and special purpose hardware devices that cooperatively provide the functionality of the node management engine.

The persistent storage (204) includes any number of non-volatile storage devices including, but not limited to, magnetic memory devices, optical memory devices, solid state memory devices, phase change memory devices, any other suitable type of persistent memory device, or any combination thereof. The persistent storage may store data received from the client devices (100), the data processor (102), from applications executing on the node (200), and/or from other nodes (106A, 106M) in the cluster.

The data protection domain (DPD) information (206) (also referred to as node-specific DPD information) specifies information about the other nodes to which the node (200) is connected (i.e., via the communication interfaces (208)). The DPD information may include, but is not limited to: (i) the name of each node to which the node (200) is connected; (ii) a communication interface identifier (ID) that specifies the communication interface on the node (200) that is connected to the node (i.e., the node that is specified in (i)); and an address of the node (i.e., the node that is specified in (i)). The content and format of the address may vary based on the communication protocol that is being implemented between the nodes. An example of an address in an Internet Protocol (IP) address.

The DPD information (206) may also include other information such as, but not limited to, (i) a listing of all supported erasure coding schemes (see e.g., FIGS. 12-14C), (ii) a default (or selected) erasure coding scheme (see e.g., FIGS. 12-14C), (iii) a specification of a replica path(s) (see e.g., FIGS. 10.1-11), and/or (iv) a specification of a chunk path(s) (see e.g., FIGS. 10.1-11). Each of the aforementioned additional information that may be included in the DPD information is further described below.

In one embodiment of the invention, erasure coding is the use of parity values to protect data. The parity values are calculated using the data and then stored with the data. If a portion of the data becomes corrupted, or is otherwise unavailable, the parity value(s) may be used to rebuild the corrupted portion of the data.

In one or more embodiments of the invention, erasure coding includes dividing the obtained data into portions, referred to as data chunks. The individual data chunks may then be combined (or otherwise grouped) into slices. One or more parity values are then calculated for each of the aforementioned slices. The number of parity values may vary based on the erasure coding scheme. An erasure coding scheme may be represented as the ratio of data chunks (M) to parity chunks (N) in each slice, e.g., M:N. Non-limiting examples of erasure coding schemes are 2:1, 2:2, 3:1, 4:1, 9:5, etc. Other erasure coding schemes may be used without departing from the invention. Continuing with the above discussion, if the erasure code scheme is 3:1, then a single parity value is calculated. The resulting parity value is then stored in a parity chunk. If erasure coding scheme requires multiple parity values to be calculated, then the multiple parity values are calculated with each parity value being stored in a separate data chunk.

As discussed above, the data chunks are used to generate parity chunks in accordance with the erasure coding scheme. More specifically, the parity chunks may be generated by applying a predetermined function (e.g., P Parity function, Q Parity Function, etc.), operation, or calculation to at least one of the data chunks. Depending on the erasure coding scheme used, the parity chunks may include, but are not limited to, P parity values and/or Q parity values.

In one embodiment of the invention, the P parity value is a Reed-Solomon syndrome and, as such, the P Parity function may correspond to any function that can generate a Reed-Solomon syndrome. In one embodiment of the invention, the P parity function is an XOR function.

In one embodiment of the invention, the Q parity value is a Reed-Solomon syndrome and, as such, the Q Parity function may correspond to any function that can generate a Reed-Solomon syndrome. In one embodiment of the invention, a Q parity value is a Reed-Solomon code. In one embodiment of the invention, $Q = g_0 \cdot D_0 + g_1 \cdot D_1 + g_2 D_2 + \ldots + g_{n-1} \cdot D_{n-1}$, where Q corresponds to the Q parity, g is a generator of the field, and the value of D corresponds to the data in the data chunks.

Continuing with the discussion of DPD information, the listing of all supported erasure coding schemes may be corresponding to either: (i) the erasure coding schemes that may be performed by the node, i.e., the node includes the necessary functionality to store data using any of the supported erasure coding schemes; or (ii) the erasure coding schemes that may actually be implemented based on the number of nodes in the cluster. For example, if there are only three nodes in the cluster, then a 3:1 erasure coding scheme, which requires four nodes (e.g., three nodes to store data chunks and one node to store parity chunks) may not be implemented.

If the listing of erasure coding schemes is all supported erasure coding schemes, then default erasure coding scheme that is specified is one of the supported erasure coding schemes that can actually be implemented in the cluster. In scenarios in which the DPD information specifies multiple erasure coding schemes that may actually be implemented, the client (or data processor) may specify which erasure coding scheme to use from the aforementioned set of implementable erasure coding schemes and, if no specific erasure coding scheme is specified, then the node may apply the default erasure coding scheme.

As discussed below in FIG. 5, the DPD information may be dynamically updated based on state changes of the nodes (e.g., one or more nodes be unavailable or available). In these scenarios, the listing of implementable erasure coding schemes and/or the default erasure coding scheme may be updated based on the updates to the DPD information. For example, if the cluster initially included five nodes, then the supported erasure coding schemes may be 4:1, 3:2, 3:1, 2:2 and 2:1 and the default erasure coding scheme may be set to 3:1 (i.e., three data chunks to one parity chunk). However, if the number of nodes in the cluster decreases to three, then the supported erasure coding schemes may be updated to only 2:1, which would also be specified as the default erasure coding scheme. If at a later point in time one additional node becomes active, then the supported erasure coding schemes may be updated to 3:1 and 2:1, with 3:1 designated as the default erasure coding scheme. The invention is not limited to the aforementioned example.

Continuing with the discussion of DPD information, as discussed above, the DPD information may specify a replica path and a chunk path. The replica path corresponds to a logical or physical path over which a replica (e.g., a copy of file) is transmitted between nodes. The chunk path corresponds to a logical or physical path over which a chunk(s) of data (e.g., portions of a file) are transmitted between nodes. The replica path may specify a set of nodes that are to receive replicas from the node (200) via the replica path. The chunk path may specify a set of nodes to receive data chunks from the node (200) via the chunk path. In one embodiment of the invention, the DPD information may specify multiple replica paths, where the replica paths specify different numbers of nodes, which determines the number of replicas that are to be stored. For example, if there are six nodes in the cluster, then the cluster may support both a two-replica path (e.g., the cluster will include two copies of a file) and a three-replica path (e.g., the cluster will include three copies of a file). The replica path that is selected may be based on: (i) number of nodes in the cluster, (ii) configuration of the node to use a particular replica path, and/or (iii) specification in the request (from a client or a data processor) to use a particular replica path. Additional detail about replica paths and chunk paths is provided below in FIGS. 10.1-11.

In one embodiment of the invention, the DPD information may be specified using JavaScript Object Notation (JSON), eXtensible Markup Language (XML) or any other language or format without departing from the invention.

The communication interfaces (208) may include any type of communication interface (208A, 208P) that enables a physical connection to be established between the node (200) and another node (not shown). The communication interfaces (208) may be implemented using a combination of physical ports and corresponding hardware and/or software. The specific hardware and/or software used to implement the communication interfaces may vary based on the communication protocol used. Examples of communication protocols include, but are not limited to, Ethernet and Infiniband.

The applications (210) include any software application that include functionality to issue requests (e.g., read and/or write requests). Though not shown in FIG. 2, the application may be executing directly on the node. Alternatively, the application may be executing on a virtual machine or in a container, where the virtual machine or container are executing on the node.

While the node shown in FIG. 2 has been illustrated and described as including a limited number of specific components, a node in accordance with one or more embodiments of the invention may include additional, fewer, and/or different components without departing from the invention.

Figure 3:
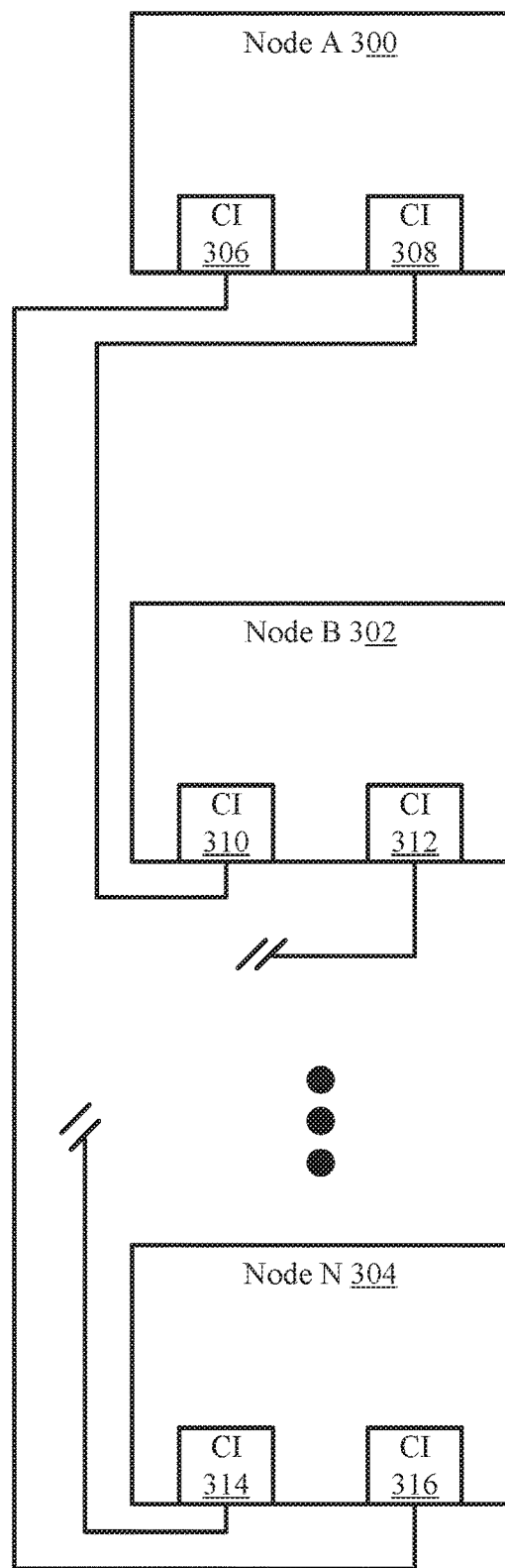
FIG. 3 shows a diagram of single-chain configuration in accordance with one or more embodiments of the invention.
Figure 4:
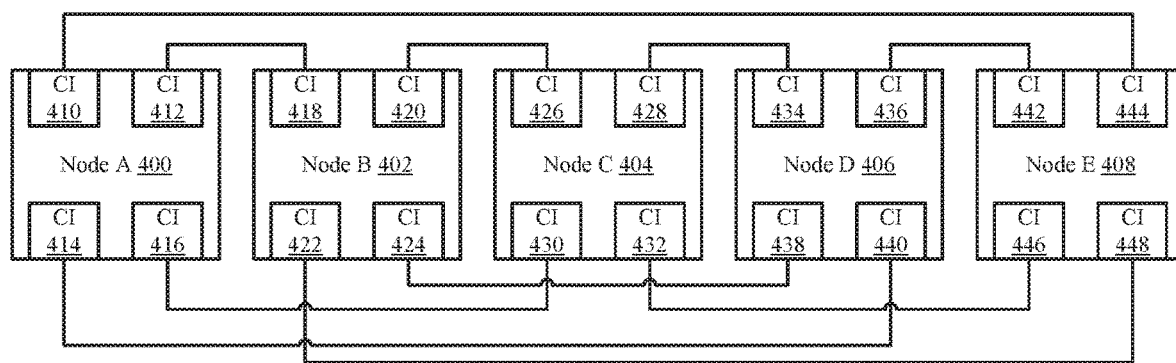
FIG. 4 shows a diagram of dual-chain configuration in accordance with one or more embodiments of the invention.

As discussed above, the nodes may be linked together in a daisy chain configuration. FIGS. 3-4 show two example daisy chain configurations. Other daisy chain configurations may be implemented without departing from the invention.

FIG. 3 shows a diagram of single-chain configuration in accordance with one or more embodiments of the invention. In a single-chain configuration, each node is connected to two other nodes using distinct communication interfaces. For example, a node may implement communication interfaces using physical ports, where each port is considered a distinct communication interface. While the ports are distinct, the additional hardware and/or software used to implement the communication interfaces may be shared between the ports.

Continuing with the discussion of FIG. 3, each node is physically connected to two other nodes using two distinct physical paths. For example, Node A (300) is connected to Node B (302) using communication interface (CI) (308) and CI (310). Further, Node A (300) is connected to Node N (304) using CI (306) and CI (316). Similarly, Node B (302) and Node N (304) include CI (312) and CI (314), respectively, which may be connected to other nodes (not shown) in the single-chain configuration.

The single-chain configuration results in each node have two immediate neighbors, i.e., two other nodes to which they are directly connected. Said another way, a given node may communicate with its immediate neighbors without having to transmit such communication via any other interposed node. In the single-chain configuration, the node along with its two immediate neighbors may be referred to as a data protection group (DPG). A given node may be a member of up to three DPGs in a single-node configuration. The node-specific DPD information that is maintained by the node may include information about all nodes in the DPG.

FIG. 4 shows a diagram of dual-chain configuration in accordance with one or more embodiments of the invention. As shown in FIG. 4, in a dual-chain configuration, each node is connected to four other nodes using distinct communication interfaces. For example, a node may implement communication interfaces using physical ports, where each port is considered a distinct communication interface. While the ports are distinct, the additional hardware and/or software used to implement the communication interfaces may be shared between the ports.

Continuing with the discussion of FIG. 4, each node, in the example shown in FIG. 4, is physically connected to four other nodes using four distinct physical paths using combinations (as shown) of the following communication interfaces (410, 412, 414, 416, 418, 420, 422, 424, 426, 428, 430, 432, 434, 436, 438, 440, 442, 444, 446, 448). For example, Node C (404) is connected to Node B (402), Node D (406), Node A (400) and Node E (408). Node C (404) is connected to Node B (402) and Node D (406) in a manner that is similar to the single-chain configuration in FIG. 3. However, Node C (404) is connected to Node A (400) and Node E (408) in a slightly different manner. Specifically, when viewed in the context of a single-node configuration Node A (400) would not be considered immediate neighbors of Node C (404) because Node B (402) would be interposed between Node C (404) and Node A (400). However, in a dual-chain configuration, nodes that would not be considered immediate neighbors in a single-chain configuration are also directly connected to each other thereby also making such nodes immediate neighbors. Said another way, in a single-chain configuration only nodes that are one hop from each other are directly connected and considered immediate neighbors, while in a dual-chain configuration nodes that are both one hop and two hops from a given node (when viewed from a single-chain configuration) are directly connected resulting in two additional immediate neighbors of the given node.

In this context, the DPG for a given node in a dual-chain configuration includes up to four immediate neighbors. Further, each node may be associated with up to five DPGs.

Figure 5:
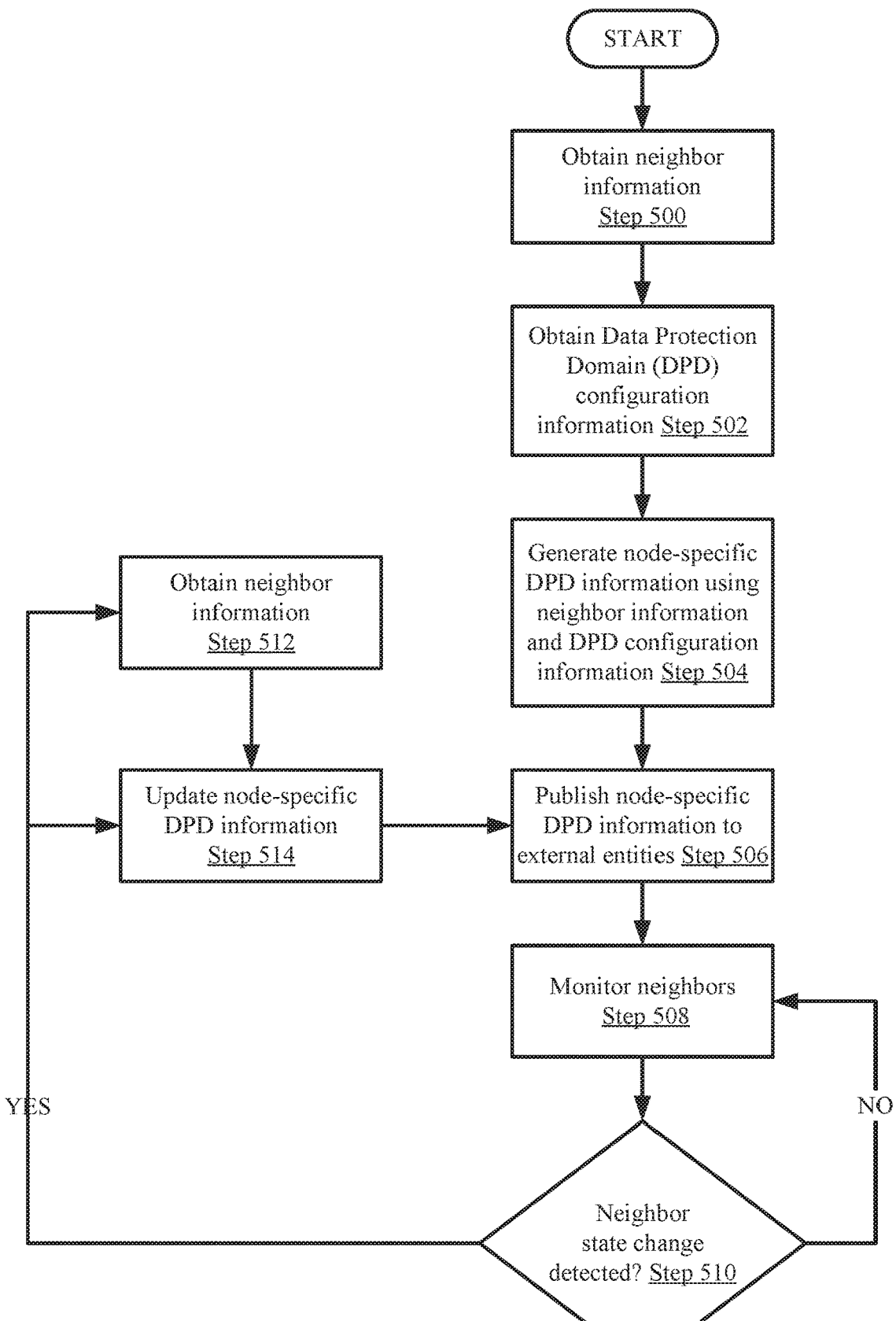
FIG. 5 shows a flowchart of a method of discovering data protection domain information in accordance with one or more embodiments of the invention.

FIG. 5 shows a flowchart of a method of discovering data protection domain (DPD) information in accordance with one or more embodiments of the invention. The method shown in FIG. 5 may be performed on a per-node basis. Further, the method shown in FIG. 5 may be performed by the node management engine (or another component) in the node.

While FIG. 5 is illustrated as a series of steps, any of the steps may be omitted, performed in a different order, additional steps may be included, and/or any or all of the steps may be performed in a parallel and/or partially overlapping manner without departing from the invention.

In Step 500, neighbor information is obtained from nodes that are directly connected to the node (i.e., from immediate neighbor nodes). The neighbor information may be obtained from a node by requesting information from the node (e.g., IP address of the immediate neighbor node, the name of the immediate neighbor, etc.). In this scenario, the node may issue a request from each of its communication interfaces (or from each of its active communication interfaces) and then track what neighbor information is received from each request on a per-communication interface basis.

In another embodiment of the invention, each node may publish its own neighbor information on each of its communication interfaces (or from each of its active communication interfaces). In this scenario, the node may track what neighbor information is received from on a per-communication interface basis.

In Step 502, DPD configuration information is obtained. The DPD configuration information may include information about erasure coding schemes that can be implemented on the node, a default erasure coding scheme to implement on the node, information about replica paths, and information about chunk paths. The DPD configuration information may be pre-loaded on the nodes and/or obtained from another node, a data processor, an application, and/or from one or more clients. In some embodiments of the invention, the DPD configuration information is not required and, as such, no DPD configuration information is obtained.

In Step 504, node-specific DPD information is generated using the neighbor information and, if obtained, the DPD configuration information. The generation of the node-specific DPD information includes determining which neighbor information was received on which communication interface and then generating node-specific DPD information. At this stage, the node-specific information may correspond to a data structure that is populated with neighbor information as well as the communication interface on the node over which the corresponding neighbor is connected. Once the data structure is populated with the aforementioned information about the immediate neighbors, then information related to the erasure coding schemes and/or information related to the replica paths and chunk paths may be added to the node-specific DPD information. Other methods for generating the node-specific DPD information may be used without departing from the invention.

In Step 506, the node-specific DPD information may be published to external entities. In this context, the external entities may be other nodes in the cluster, the data processor, clients, and/or applications executing on the node and/or other nodes. As discussed above, external entities may obtain node-specific DPD information from various nodes in a cluster and then generate aggregated DPD information (which may be aggregated for all nodes in a cluster or at other levels of granularity such as for a subset of the nodes the cluster). The aggregated DPD information includes a listing of all nodes (or a subset of nodes) in the cluster (or at least all nodes that are specified in the node-specific DPD information upon which the aggregated DPD information is based) as well as information about how each node is connected to other nodes in the cluster. This aggregated DPD information may be used by the external entities to aid in the storage or recovery of data in accordance with one or more embodiments of the invention.

As discussed above, the node-specific DPD information may be dynamically updated by each of the nodes. The dynamic updating allows the nodes to maintain up-to-date DPD information. Said another way, if the connectivity of the nodes in the cluster changes, e.g., one or more nodes becomes unreachable or unavailable, then node-specific DPD information is updated to reflect this change. As described below, the updated DPD information may then be used to service requests. The updating of the DPD information may be done in a manner that ensures that the requests are always processed using the most up-to-date DPD information.

Continuing with the discussion of FIG. 5, in Step 508, the node monitors its immediate neighbors. The monitoring may include periodically sending a message on each of its communication interfaces and then awaiting a response. If the communication interface (as specified in the node-specific DPD information) is currently connected to an immediate neighbor, then the node may expect a response within a specific period of time. If a response is received, then the monitoring continues; however, if a response is not received then a neighbor state change is detected (Step 510). Alternatively, each of the immediate neighbors is configured to periodically send a message (e.g., a keep-alive message) on each of its communication interfaces. If a message is received as expected, then the monitoring continues; however, if a message is not received then a neighbor state change is detected (Step 510).

The aforementioned scenarios focus on a node that was previously active becoming unavailable or inaccessible. However, the monitoring may also be used to detect the presence of a new node and/or a node that was previously unavailable or inaccessible becoming active. For example, if a response or a message is received on a communication interface that is not currently specified in the node-specific DPD information, then the neighbor state change is detected (Step 510); otherwise, the monitoring continues.

In Step 510, if a neighbor state change is detected, the process proceeds to step 512 or 514; otherwise, the process proceeds to step 508. The process may proceed to step 512 if the neighbor state change is triggered by the detection of a new node and/or a node that was previously unavailable or inaccessible becoming active. The process may proceed to step 514 if neighbor state change is triggered by a node that was previously active becoming unavailable or inaccessible.

In Step 512, neighbor information for the new node or the previously inactive or unavailable node is obtained using the same or similar process as described in step 500.

In Step 514, the node-specific DPD information is updated to: (i) remove neighbor information and/or (ii) add neighbor information obtained in step 512. The process then proceeds to step 506.

Figure 6:
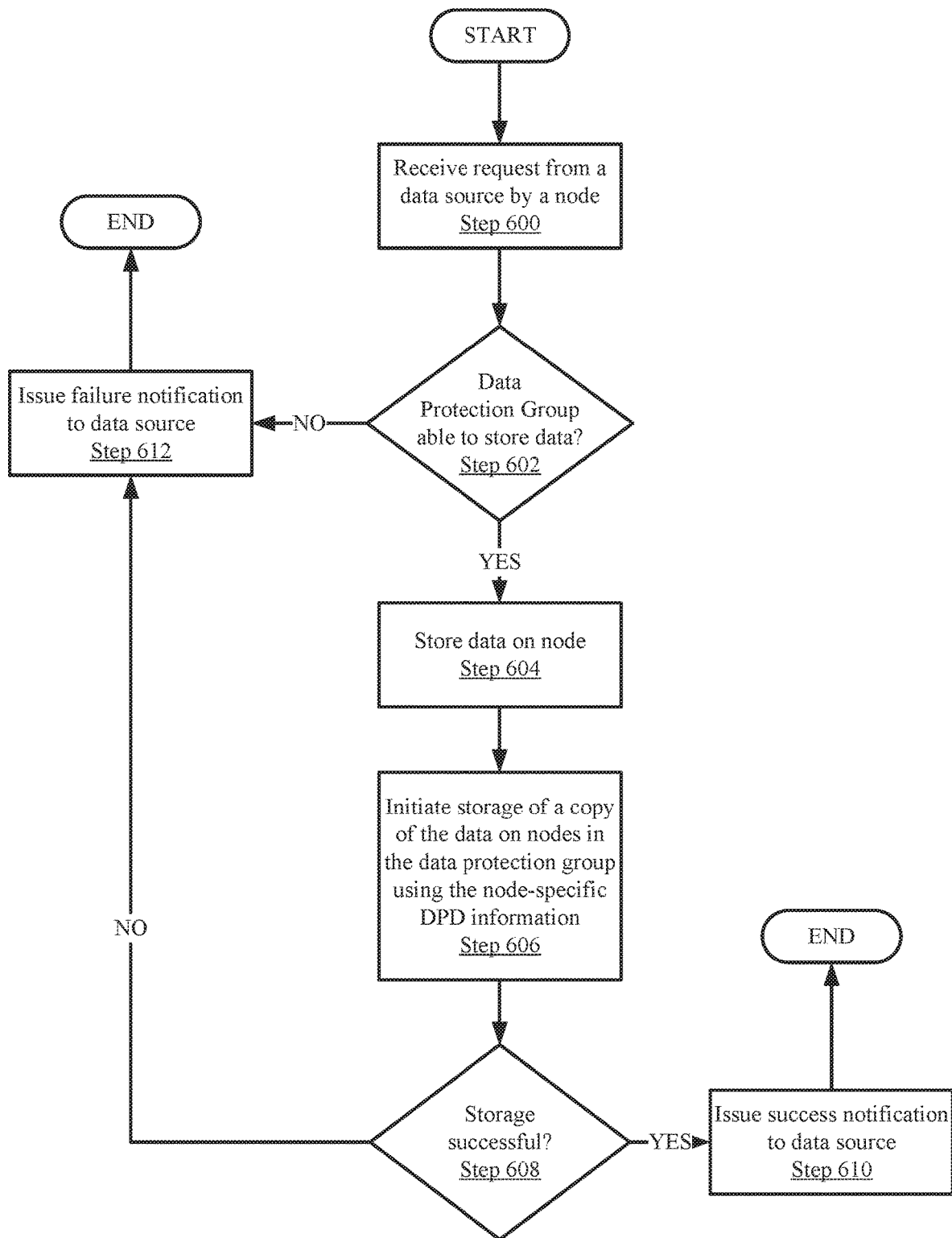
FIG. 6 shows a flowchart of a method of storing data in nodes in accordance with one or more embodiments of the invention.

FIG. 6 shows a flowchart of a method of storing data in nodes in accordance with one or more embodiments of the invention. The method shown in FIG. 6 may be performed on a per-node basis. Further, the method shown in FIG. 6 may be performed by the node management engine (or another component) in the node.

While FIG. 6 is illustrated as a series of steps, any of the steps may be omitted, performed in a different order, additional steps may be included, and/or any or all of the steps may be performed in a parallel and/or partially overlapping manner without departing from the invention.

In Step 600, a request to store data is received by a node from a data source. The data source may be a client, a data processor, and/or an application executing on a node. There may be other data sources without departing from the invention. The data source may or may not have aggregated DPD information.

In Step 602, a determination is made about whether the DPG is able to store the data. If the DPG is able to store the data, then the process proceeds to step 604; otherwise, the process proceeds to step 612.

The determination in step 602 may include determining whether: (i) the node that received the request can itself store the data and/or (ii) whether there are a sufficient number of nodes in the DPG. With respect to (i), this determination covers the scenario in which the node that received the request has itself failed, is unable to store data in its persistent storage, and/or is unable to facilitate the storage of data in the DPG. With respect to (ii), this determination covers whether there are a sufficient number of members in the DPG in order to service the request. This determination is made using the node-specific DPD information. For example, if the data is to be stored such that there are ultimately three copies of the data stored in the DPG, where each copy of the data is stored on a separate node in the DPG, then the node-specific DPD information needs to include at least two immediate neighbor nodes. However, if there is only one immediate neighbor node specified in the node-specific DPD information, then the DPG may be deemed unable to store the data.

The determination in (ii) may be performed on a per-request basis based on information specified in the request about the data protection scheme (e.g., replicas and/or erasure coding) to be used to store the data. If the request does not specify any data protection scheme, then a default data protection scheme (e.g., as specified in the DPD information and/or elsewhere in the node) may be used to determine the minimum number of immediate neighbors required to store the data. This information may then be used to make the determination in (ii).

In Step 604, the data is stored on the node, e.g., in persistent storage.

In Step 606, the node initiates the storage of copies of the data on one or more other nodes in the DPG using the node-specific DPD information. For example, the node may select an immediate neighbor node specified in the node-specific DPD information. The node may then generate a request to the selected node. The request may then be transmitted to the selected immediate neighbor node via the communication interface specified in the DPD information using the address, e.g., an IP address, associated with the selected immediate neighbor node. The above process may be repeated for each selected node, where the number of selected nodes corresponds to the number of replicas required. For example, if there are three total copies required (i.e., the data plus two replicas), then the above process is repeated twice—once for each selected immediate neighbor node.

If there are more immediate neighbor nodes specified in the node-specific DPD information than are required to service the request (e.g., there are four immediate neighbor nodes but only two immediate neighbor nodes are required), then any known or later discovery mechanism may be used to select a subset of the immediate neighbor nodes. For example, the immediate neighbor nodes may be selected arbitrarily, using a round-robin mechanism, or using the current load on each of the immediate neighbor nodes.

In Step 608, a determination is made about whether the data storage in the DPG is successful. If the data storage is successful, then the process proceeds to step 610; otherwise, the process proceeds to step 612.

The determination in step 608 may include: (i) determining whether the storage of the data on the node is successful and (ii) whether the data is successfully stored on each of the selected immediate neighbor nodes in the DPG. With respect to (ii), the selected immediate neighbor nodes may send a success or failure notification to the node via the physical paths that connect the node to the selected immediate neighbor nodes. The selected node may send a success notification when the data is successfully stored on the node. The selected immediate neighbor node may send a failure notification if the selected immediate neighbor node is unable to store the data in its persistent storage. In another embodiment of the invention, a failure may be determined to have occurred when no response is received from an immediate neighbor node after the request is sent. This scenario may occur if, after the request is sent, the neighbor node subsequently fails or otherwise becomes unavailable or unreachable. Depending on the circumstances that give rise to a failure notification, the failure notification may include information about the cause of the failure.

In Step 610, when the determination in step 608 indicates successful storage of the data in the DPG, then a success notification is sent to the data source (i.e., the entity that sent the request in step 600).

In Step 612, when the determination in step 602 indicates that the DPG is unable to store the data or the determination in step 608 indicates that the storage of the data in the DPG is not successful, then a failure notification is sent to the data source. Depending on the circumstances that give rise to a failure notification, the failure notification may include information about the cause of the failure. If the node to which the request in step 600 is sent itself fails or otherwise is unavailable or unreachable by the data source, then a failure of the request may be inferred by the data source when no response is received from the node by the data source after a pre-determined period of time.

Figure 7:
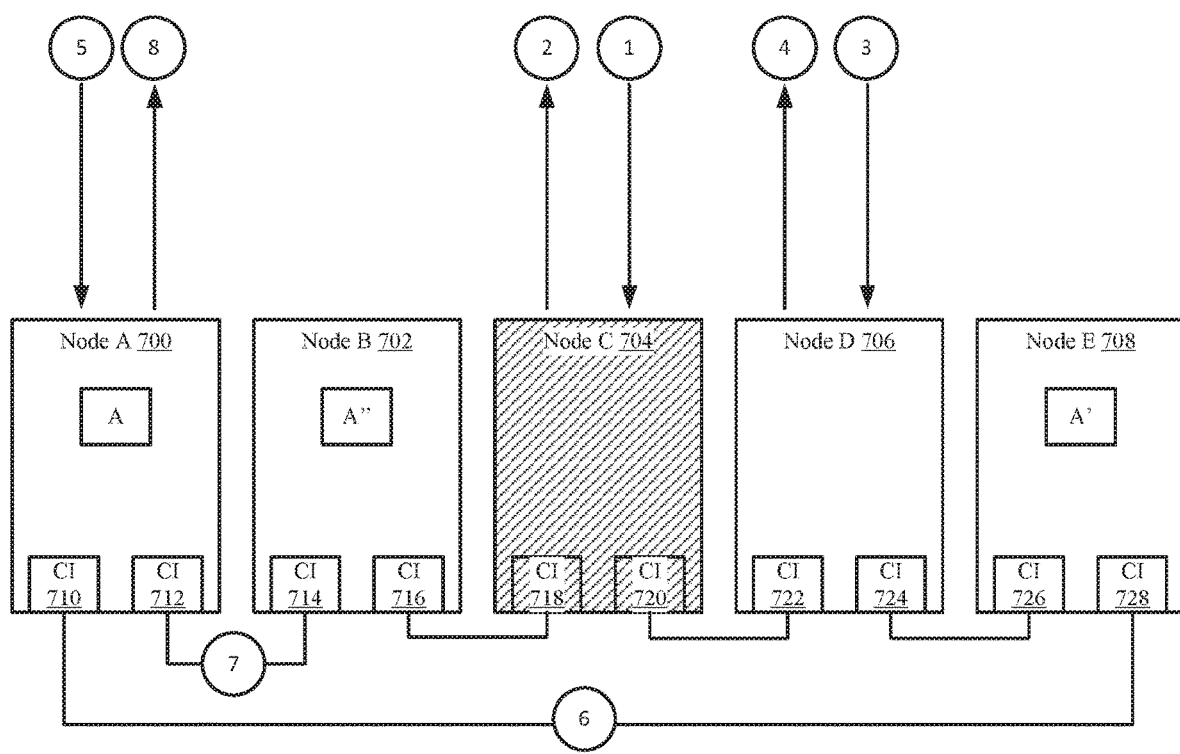
FIG. 7 shows a diagram of an example of storing data in nodes in accordance with one or more embodiments of the invention.

FIG. 7 shows a diagram of an example of storing data in nodes in accordance with one or more embodiments of the invention. The example is not intended to limit the scope of the invention.

Turning to the example, consider a scenario in which a data processor (not shown) attempts to write data (e.g., File A—denoted as "A") to the cluster. In this example, the cluster includes five nodes (Node A (700), Node B (702), Node C (704), Node D (706), Node E (708)). Further, the nodes in the cluster are arranged in a single-chain configuration using communication interfaces (710, 712, 714, 716, 718, 720, 722, 724, 726, 728).

Initially, the data processor (which does not have aggregated DPD information) is able to issue requests to the individual nodes in the cluster, and issues a request to Node C (704) [1]. Node C (704) has failed. Accordingly, the data processor does not receive a response from Node C (704) and determines the request has failed [2]. The data processor then issues a request to Node D (706) [3]. Node D (706) receives the request and using the node-specific DPD information determines that three copies of File A need to be stored in the DPG to which Node D (706) belongs. Node D (706) includes node-specific DPD information, which specifies that Node E (708) is an immediate neighbor. However, no other immediate neighbor nodes are specified in the node-specific DPD information. Because there are only two nodes in the DPG (i.e., Node D (706) and Node E (708)), the Node D (706) responds to the data processor and indicates that the DPG is unable to service the request [4].

The data processor then issues a request to Node A (700) [5]. Node A (700) receives the request and, using the node-specific DPD information, determines that three copies of File A need to be stored in the DPG to which Node A (700) belongs. Node A (700) includes node-specific DPD information, which specifies that Node B (702) and Node E (708) are immediate neighbors (i.e., the DPG includes Node A (700), Node B (702), and Node E (708)). Node A (700), subsequently stores a File A ("A") on Node A (700). Node A (700) then issues a request to Node E (708), which Node E (708) subsequently services resulting in a copy of File A ("A") being stored on Node E (708) [6]. Node A (700) then issues a request to Node B (702), which Node B (702) subsequently services resulting in a copy of File A ("A") being stored on Node B (702) [7]. Steps [6] and [7] may be performed concurrently. After all the three copies of File A have been stored in the cluster, Node A (700) issues a success notification to the data processor.

Figure 8:
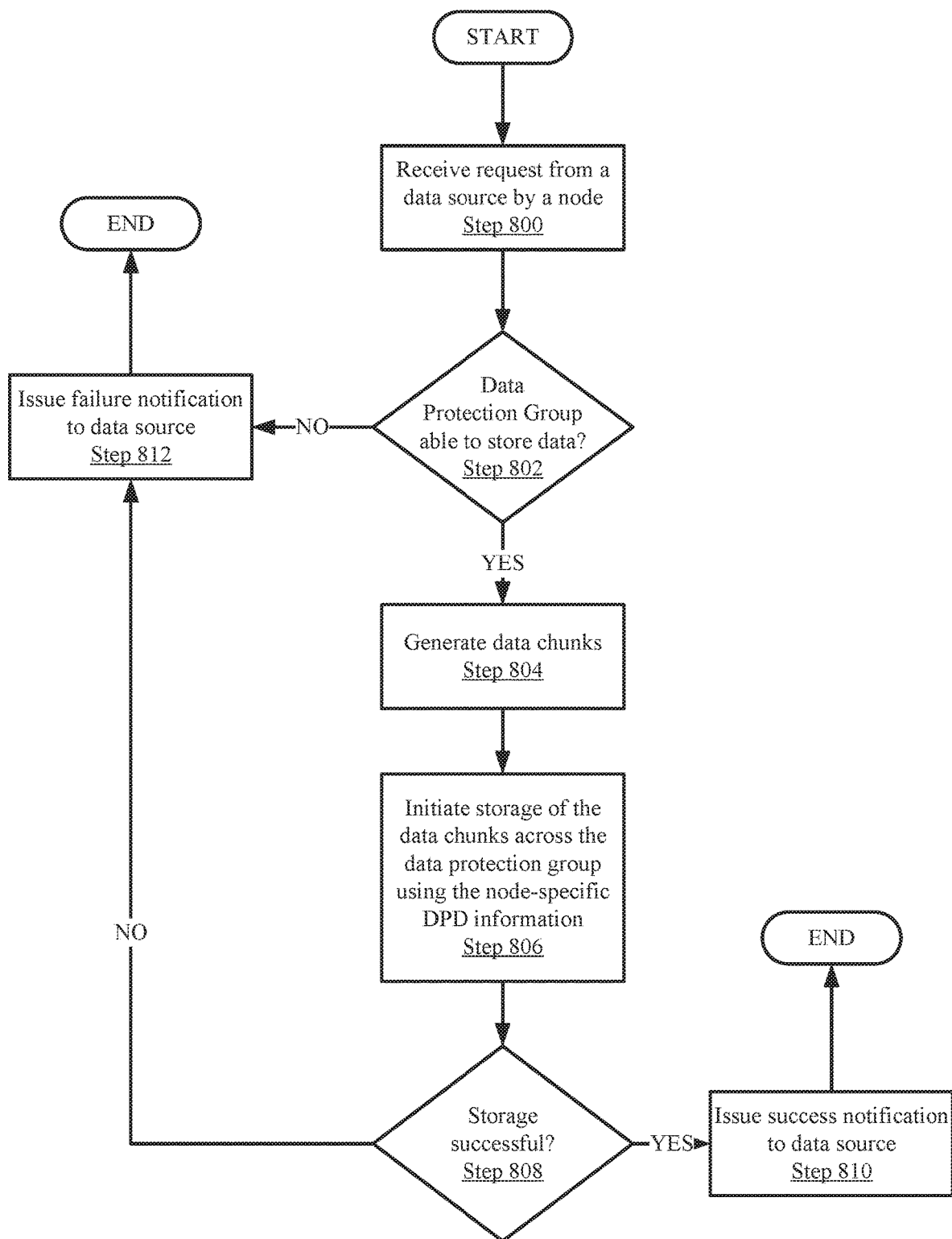
FIG. 8 shows a flowchart of a method of storing data in nodes in accordance with one or more embodiments of the invention.

FIG. 8 shows a flowchart of a method of storing data in nodes in accordance with one or more embodiments of the invention. Further, the method shown in FIG. 8 may be performed by the node management engine (or another component) in the node.

While FIG. 8 is illustrated as a series of steps, any of the steps may be omitted, performed in a different order, additional steps may be included, and/or any or all of the steps may be performed in a parallel and/or partially overlapping manner without departing from the invention.

In Step 800, a request to store data is received by a node from a data source. The data source may be a client, a data processor, and/or an application executing on a node. There may be other data sources without departing from the invention. In this embodiment, the data source includes aggregated DPD information and uses this information in order to determine to which nodes to issue requests.

In Step 802, a determination is made about whether the DPG is able to store the data. If the DPG is able to store the data, then the process proceeds to step 804; otherwise, the process proceeds to step 812.

The determination in step 802 may include determining whether: (i) the node that received the request can itself store the data (or data chunks) and/or (ii) whether there are a sufficient number of nodes in the DPG. With respect to (i), this determination covers the scenario in which the node that received the request has itself failed, is unable to store data (or data chunks) in its persistent storage, and/or is unable to facilitate the storage of data (or data chunks) in the DPG. With respect to (ii), this determination covers whether there are a sufficient number of members in the DPG in order to service the request. This determination is made using the node-specific DPD information. For example, if the data chunks (i.e., portions of the data) are to be stored such that the data chunks are evenly (or substantially evenly) distributed across three nodes, then the node-specific DPD information needs to include at least two immediate neighbor nodes. However, if there is only one immediate neighbor node specified in the node-specific DPD information, then the DPG may be deemed unable to store the data or data chunks.

The determination in (ii) may be done on a per-request basis based on information specified in the request about the data protection scheme (e.g., replication) to be used to store the data. If the request does not specify any data protection scheme, then a default data protection scheme (e.g., as specified in the DPD information and/or elsewhere in the node) may be used to determine the minimum number of immediate neighbors required to store the data. This information may then be used to make the determination in (ii).

In Step 804, if the DPG can store the data, then the node divides the data in chunks also referred to as data chunks. The data chunks may be the same size or substantially similar in size. Alternatively, the data chunks have different sizes without departing from the invention.

In Step 806, the node initiates the storage of data chunks across the nodes in the DPG using the node-specific DPD information. For example, the node may select an immediate neighbor node specified in the node-specific DPD information. The node may then generate a request to the selected node. The request may specify a portion of the data chunks and may be transmitted to the selected immediate neighbor node via the communication interface specified in the DPD information using the address, e.g., an IP address, associated with the selected immediate neighbor node. The above process may be repeated for each selected node, where the number of selected nodes corresponds to the number of replicas required. For example, if there are three nodes in the DPG, then the above process is repeated twice—once for each selected immediate neighbor node. For the data chunks that are not written to the other members in the DPG, the node initiates the storage of such data chunks in the persistent storage.

Once all requests have been sent, each of the data chunks is stored on one of the nodes (or members) that is part of the DPG. The specific number of data chunks stored on each of the nodes in the DPG may be the same or substantially similar. In other embodiments of the invention, the data chunks may not be divided equally across the nodes in the DPG. Further, the specific data chunks stored on each of the nodes may be determined using a round-robin scheme, may be selected arbitrarily or randomly, or may be selected using any other scheme without departing from the invention.

If there are more immediate neighbor nodes specified in the node-specific DPD information than are required to service the request (e.g., there are four immediate neighbor nodes but only two immediate neighbor nodes are required), then any known or later discovery mechanism may be used to select the immediate neighbor nodes. For example, the immediate neighbor nodes may be selected arbitrarily, using a round-robin mechanism, or using the current load on each of the immediate neighbor nodes.

In Step 808, a determination is made about whether the data storage in the DPG was successful. If the data storage was successful, then the process proceeds to step 810; otherwise, the process proceeds to step 812.

The determination in step 808 may include: (i) determining whether the storage of the portion of the data chunks on the node is successful and (ii) whether the other portions of the data chunks are successfully stored on each of the selected immediate neighbor nodes in the DPG. With respect to (ii), the selected immediate neighbor nodes may send a success or failure notification to the node via the physical paths that connect the node to the selected immediate neighbor nodes. The selected immediate neighbor nodes may send a success notification when the data chunks are successfully stored on the selected immediate neighbor node. The selected immediate neighbor node may send a failure notification if the selected immediate neighbor node is unable to store the data chunks in its persistent storage. In another embodiment of the invention, a failure may be determined to have occurred when no response is received from a selected immediate neighbor node after the request is sent. This scenario may occur if, after the request is sent, the selected immediate neighbor node subsequently fails or otherwise becomes unavailable or unreachable. Depending on the circumstances that give rise to a failure notification, the failure notification may include information about the cause of the failure.

In Step 810, when the determination in step 808 indicates successful storage of the data chunks in the DPG, then a success notification is sent to the data source.

In Step 812, when the determination in step 802 indicates that the DPG is unable to store the data chunks or the determination in step 808 indicates that the storage of the data in the DPG was not successful, then a failure notification is sent to the data source. Depending on the circumstances that give rise to a failure notification, the failure notification may include information about the cause of the failure. If the node to which the request in step 800 is sent itself fails or otherwise is unavailable or unreachable by the data source, then a failure of the request may be inferred by the data source when no response is received from the node after a pre-determined period of time.

Figure 9:
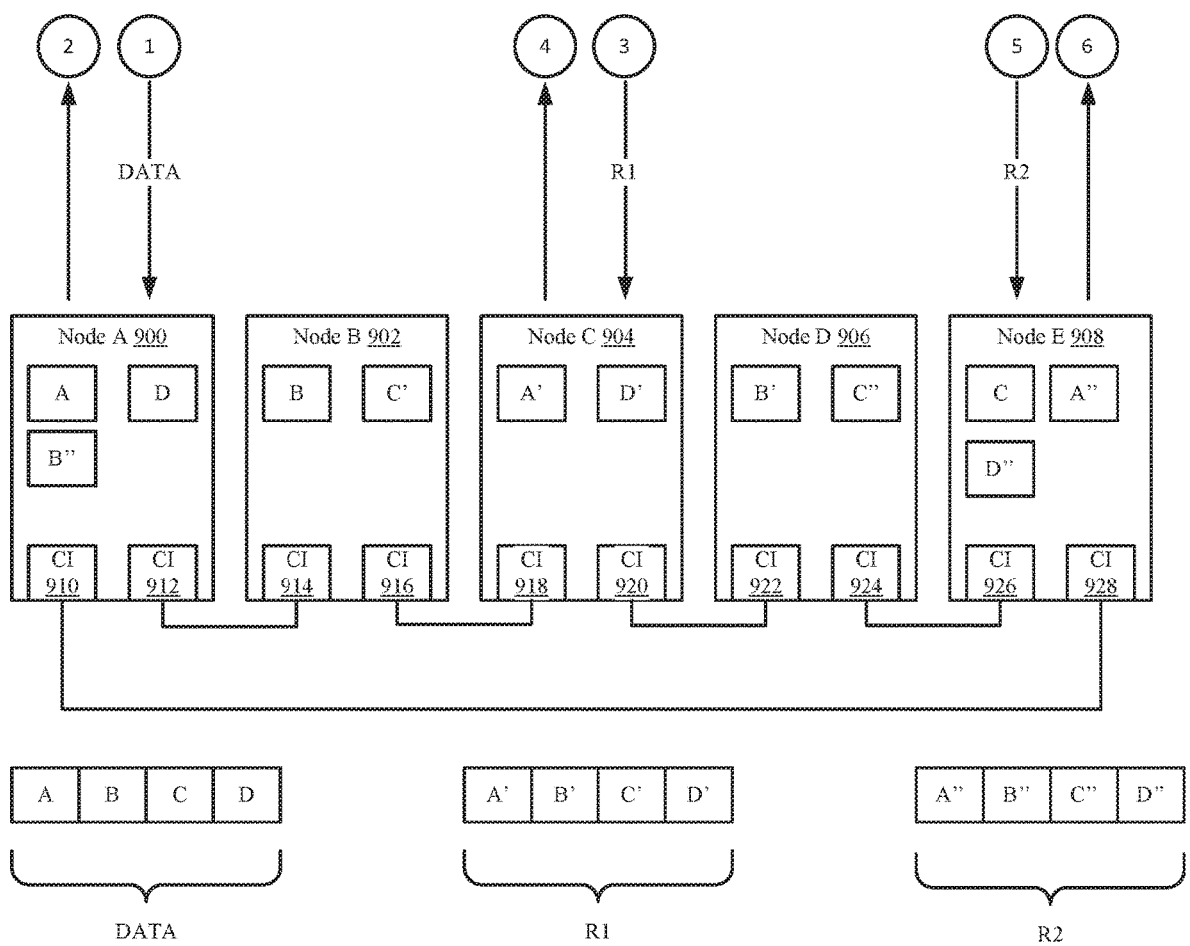
FIG. 9 shows a diagram of an example of storing data in nodes in accordance with one or more embodiments of the invention.

FIG. 9 shows a diagram of an example of storing data in nodes in accordance with one or more embodiments of the invention. The example is not intended to limit the scope of the invention.

Turning to the example, consider a scenario in which a data processor (not shown) implements a scale-out file system (SoFS) where the SoFS includes the aggregated DPD information. The SoFS uses the aggregated DPD information to determine that the nodes in the cluster (Node A (900), Node B (902), Node C (904), Node D (906), Node E (908)) are configured in a single-chain configuration using communication interfaces (910, 912, 914, 916, 918, 920, 922, 924, 926, 928). Based on this understanding of the arrangement of nodes in the cluster, the SoFS may select nodes to which to issue requests. In this example, the SoFS wants to store three copies of a DATA in the cluster. However, the SoFS also wants to ensure that the three copies of the DATA are distributed across the nodes in the cluster in a manner that minimizes the risk of losing the DATA if one or more of the nodes fails or is otherwise unavailable. Using the aggregated DPD information, the SoFS issues a first request to Node A (900) to store DATA [1], a second request to Node C (904) to store a copy of the DATA (R1) [3], and a third request to store a second copy of DATA (R2) to Node E (908) [5].

Each of the aforementioned nodes independently performs that method described in FIG. 8. The processing described below may occur concurrently without departing from the invention.

For example, Node A (900) divides the DATA into four data chunks [A, B, C, D] and uses a round-robin scheme (in combination with the node-specific DPD information) to store chunks A and D on Node A (900) and determine that chunk B is to be stored on Node B (902) and that chunk C is to be stored on Node E (908). Chunk B is transmitted via CI (912) to Node B (902) and chunk C is transmitted via CI (910) to Node E (908). Node B (902), after storing chunk B, transmits a success notification to Node A (900) via CI (914), which is received by CI (912) on Node A (900). Node E (908), after storing chunk C, transmits a success notification to Node A (900) via CI (928), which is received by CI (910) on Node A (900). Node A (900) after receiving the success notifications from Node B (902) and Node E (908) and after successfully storing chunks A and D in its persistent storage, sends a success notification to the SoFS [2].

Further, Node C (904) divides the R1 into four data chunks [A', B', C', D'] and uses a round-robin scheme (in combination with the node-specific DPD information) to store chunks A' and D' on Node C (904) and determine that chunk B' is to be stored on Node D (906) and that chunk C' is to be stored on Node B (902). Chunk B' is transmitted via CI (920) to Node D (906) and chunk C' is transmitted via CI (918) to Node B (902). Node B (902), after storing chunk C', transmits a success notification to Node C (904) via CI (916), which is received by CI (918) on Node C (904). Node D (906), after storing chunk B', transmits a success notification to Node C (904) via CI (922), which is received by CI (920) on Node C (904). Node C (904) after receiving the success notifications from Node B (902) and Node D (906) and after successfully storing chunks A' and D' in its persistent storage, sends a success notification to the SoFS [4].

Finally, Node E (908) divides the R2 into four data chunks [A", B", C", D"] and uses a round-robin scheme (in combination with the node-specific DPD information) to store chunks A" and D" on Node E (908) and determine that chunk B" is to be stored on Node A (900) and that chunk C" is to be stored on Node D (906). Chunk B" is transmitted via CI (928) to Node A (900) and chunk C" is transmitted via CI (926) to Node D (906). Node A (900), after storing chunk B", transmits a success notification to Node E (908) via CI (910), which is received by CI (928) on Node E (908). Node D (906), after storing chunk C", transmits a success notification to Node E (908) via CI (924), which is received by CI (926) on Node E (908). Node E (908) after receiving the success notifications from Node A (900) and Node D (906) and after successfully storing chunks A" and D" in its persistent storage, sends a success notification to the SoFS [6].

FIGS. 10.1-10.2 shows a flowchart of a method of storing data in nodes in accordance with one or more embodiments of the invention. Further, the method shown in FIGS. 10.1-10.2 may be performed by the node management engine (or another component) in the node.

The method shown in FIGS. 10.1-10.2 may enable the nodes in the cluster to receive a single request from a data source and then, independently of the data source, store data chunks in the same manner as described with respect to FIG. 8. Said another way, the method shown in FIG. 8 is an embodiment in which the storage of data and corresponding replicas is coordinated by a data source (or an external entity) such as a SoFS. In contrast, FIGS. 10.1-10.2 are directed to an embodiment in which the nodes (without the SoFS), using the node-specific DPD information (which includes replica and chunk paths), are able to coordinate the storage of data that has the same ultimate result of data storage that is achieved when using the SoFS.

Each node in the cluster may perform the methods shown in FIGS. 10.1-10.2. The specific portions of the methods performed by a given node depends on whether the node receives the request to store data from a data source, whether the node receives data on a chunk path, whether the node receives data on a replica path and the node is the replica target, or whether the node receives data on the replica path and is not the replica target.

While FIGS. 10.1-10.2 are illustrated as a series of steps, any of the steps may be omitted, performed in a different order, additional steps may be included, and/or any or all of the steps may be performed in a parallel and/or partially overlapping manner without departing from the invention.

In Step 1000, a request is received by a node from a data source. The data source may be a node, a client, a data processor, and/or an application executing on a node. There may be other data sources without departing from the invention. The data source may or may not have aggregated DPD information.

In Step 1002, a determination is made about whether the request is received on a chunk path. If the request is received on a chunk path, the process proceeds to step 1004; otherwise the process proceeds to step 1006.

The determination in step 1002 may be made using information in the request and/or information about the communication interface on which the request was received. In a single-chain configuration, the replica path and the chunk path are logical paths that share the same physical path. In this scenario, the request may include information which specifies whether the request is being transmitted via the chunk path or replica path. In a dual-chain configuration, the replica path and the chunk path are separate physical paths. In this scenario, the request may not include any information that specifies whether the request was transmitted via chunk path or replica path; rather, the node, using the node-specific DPD information, may determine whether the request was transmitted via the replica path or the chunk path based on the communication interface on which the request was received.

In Step 1004, because the request was received on the chunk path, the request is a request to store a data chunk and, as such, the node initiates storage of the data chunk (which was transmitted via the request) to its persistent storage. The process then proceeds to step 1022.

In Step 1006, because the request was not received on the chunk path, a determination is made about whether the request was received on a replica path. If the request was received on a replica path, the process proceeds to step 1008; otherwise the process proceeds to step 1012.

The determination in step 1006 may be made using information in the request and/or information about the communication interface on which the request was received. In a single-chain configuration, the replica path and the chunk path are logical paths that share the same physical path. In this scenario, the request may include information which specifies whether the request is being transmitted via the chunk path or replica path. In a dual-chain configuration, the replica path and the chunk path are separate physical paths. In this scenario, the request may not include any information that specifies whether the request was transmitted via chunk path or replica path; rather, the node, using the node-specific DPD information, may determine whether the request was transmitted via the replica path or the chunk path based on the communication interface on which the request was received.

In Step 1008, if the request was received on the replica path, then a determination is made about whether the node is the replica target. The node is the replica target if the node is to perform the step 1018 and 1020. Said another way, the node is a replica target if it manages the storage of a given replica across members in its DPG. In order to make this determination, the request may specify the name of the replica target and the node may compare the name in the request to its name (which may or may not be specified in the node-specific DPD information on the node). If the node is the replica target the process proceeds to step 1012; otherwise, the process proceeds to step 1010.

In Step 1010, when the node is not the replica target, the request is forwarded (using the node-specific DPD information, which includes the replica paths for the cluster) towards the replica target.

When the node is the replica target (step 1008) or the node did not receive the request via a replica path or a chunk path (i.e., the node received the request from, e.g., a client, a data processor, a SoFS, and/or an application), then in step 1012 a determination is made about whether the DPG is able to store the data. If the DPG is able to store the data, then the process proceeds to step 1014 or 1018; otherwise, the process proceeds to step 1026.

The determination in step 1012 may include determining whether: (i) the node that received the request can itself store the data (or data chunks) and/or (ii) whether there are a sufficient number of nodes in the DPG. With respect to (i), this determination covers the scenario in which the node that received the request is unable to store data (or data chunks) in its persistent storage, and/or is unable to facilitate the storage of data (or data chunks) in the DPG. With respect to (ii), this determination covers whether there are a sufficient number of members in the DPG in order to service the request. This determination is made using the node-specific DPD information. For example, if the data chunks (i.e., portions of the data) are to be stored such that the data chunks are evenly (or substantially evenly) distributed across three nodes, then the node-specific DPD information needs to include at least two immediate neighbor nodes. However, if there is only one immediate neighbor node specified in the node-specific DPD information, then the DPG may be deemed unable to store the data or data chunks.

The determination in (ii) may be done on a per-request basis based on information specified in the request about the data protection scheme (e.g., number of replicas) to be used to store the data. If the request does not specify any data protection scheme, then a default data protection scheme (e.g., as specified in the DPD information and/or elsewhere in the node) may be used to determine the minimum number of immediate neighbors required to store the data. This information may then be used to make the determination in (ii).

In Step 1014, when the request is not received via a replica path or chunk path, then the node that received the request is step 1000 manages the overall servicing the request. The servicing of the request includes identifying the number of replicas required (which may be specified in the request and/or be determined by the node using, e.g., node-specific DPD information) and identifying specific nodes in the cluster that will manage the storage of the individual replicas. The identity of the nodes that will manage the storage of the replicas may be determined using the replica paths specified in the node-specific DPD information, which specifies the nodes which may be selected to manage the storage of the replicas.

In Step 1016, the node sends a request to each replica node (i.e., nodes identified in step 1014 to manage the storage of the replicas) to store a replica. The request is sent via the replica path(s) specified in the node-specific DPD information. When the replica nodes receive the requests, the replica nodes may process the requests using the method described in FIGS. 10.1-10.2.

The process may arrive at step 1018 via step 1012 or step 1016. The process arrives at step 1018 via step 1012 when the request received in step 1000 is via a replica path and the node is the replica target. The process arrives at step 1018 via step 1016 when the request in step 1000 is not received via a replica path or chunk path.

In Step 1018, the node (which may or may not be a replica node) divides the data in chunks also referred to as data chunks. The data chunks may be the same size or substantially similar in size. Alternatively, the data chunks have different sizes without departing from the invention.

In Step 1020, the node initiates the storage of data chunks across the nodes in the DPG using the node-specific DPD information. For example, the node may select an immediate neighbor node specified in the node-specific DPD information. The node may then generate a request to the selected node. The request may specify a portion of the data chunks and may be transmitted to the selected immediate neighbor node via the communication interface specified in the DPD information using the address, e.g., an IP address, associated with the selected immediate neighbor node. The above process may be repeated for each selected node, where the number of selected nodes corresponds to the number of replica required. For example, if there are three nodes in the DPG, then the above process is repeated twice—once for each selected immediate neighbor node. For the data chunks that are not written to the other members in the DPG, the node initiates the storage of such data chunks in the persistent storage.

Once all requests have been sent, each of the data chunks is stored on one of the nodes (or members) that is part of the DPG. The specific number of data chunks stored on each of the nodes in the DPG may be the same or substantially similar. In other embodiments of the invention, the data chunks may not be divided equally across the nodes in the DPG. Further, the specific data chunks stored on each of the nodes may be determined using a round-robin scheme, may be selected arbitrarily or randomly, or may be selected using any other scheme without departing from the invention.

If there are more immediate neighbor nodes specified in the node-specific DPD information than is required to service the request (e.g., there are four immediate neighbor nodes but only two immediate neighbor nodes are required), then any known or later discovery mechanism may be used to select the immediate neighbor nodes. For example, the immediate neighbor nodes may be selected arbitrarily, using a round-robin mechanism, or using the current load on each of the immediate neighbor nodes.

In Step 1022, determination is made about whether the data storage was successful. If the data storage was successful, then the process proceeds to step 1026; otherwise, the process proceeds to step 1024.

When the node is storing a data chunk then the determination in step 1024 may include determining whether the data chunks are successfully stored in the node's persistent storage. The node may send a success or failure notification to the replica target via the physical paths that connect the node to the replica target (or node that received the original request in step 1000). The node may send a success notification when the data chunks are successful stored on the node. The node may send a failure notification if the node is unable to store the data chunks in its persistent storage. In another embodiment of the invention, a failure may be determined to have occurred when no response is received from the node after the request is sent. This scenario may occur if, after the request is sent, the node subsequently fails or otherwise become unavailable or unreachable. Depending on the circumstances that give rise to a failure notification, the failure notification may include information about the cause of the failure.

When the node is a replica target, then the determination in step 1024 may include: (i) determining whether the storage of the portion of the data chunks on the node was successful and (ii) whether the other portions of the data chunks were successfully stored on each of the selected immediate neighbor nodes in the DPG. With respect to (ii), the selected immediate neighbor nodes may send a success or failure notification to the node via the physical paths that connect the node to the selected immediate neighbor nodes. The selected immediate neighbor node may send a success notification when the data chunks are successfully stored on the node. The selected immediate neighbor node may send a failure notification if the selected immediate neighbor node is unable to store the data chunks in its persistent storage. In another embodiment of the invention, a failure may be determined to have occurred when no response is received from a selected immediate neighbor node after the request is sent. This scenario may occur if, after the request is sent, the neighbor node subsequently fails or otherwise become unavailable or unreachable. Depending on the circumstances that give rise to a failure notification, the failure notification may include information about the cause of the failure.

When the node is the node that received the original request to store data from a client, a data processor, and/or an application executing on a node, then the determination may include two sets of determinations: (i) determining that each replica target successfully stored in the data and (ii) determining that the node itself successfully stored in the data across its DPG (i.e., a similar determination that is made by each of the replica targets as described above). If either of the two determinations fails (i.e., data was not successfully stored), then a failure notification may be issued to the source (e.g., a client, a data processor, and/or an application executing on a node) of the request.

In Step 1024, when the determination in step 1022 indicates successful storage of the data chunks on the node, across the DPG or across the cluster, then a success notification is sent to the replica target, the node that initiated the overall storage process, or the source (e.g., a client, a data processor, and/or an application executing on a node) of the request, as appropriate.

In Step 1026, when the determination in step 1022 indicates a failure to store any of the data chunks on the node, across the DPG or across the cluster, then a failure notification is sent to the replica target, the node that initiated the overall storage process, or the source (e.g., a client, a data processor, and/or an application executing on a node) of the request, as appropriate Depending on the circumstances that give rise to a failure notification, the failure notification may include information about the cause of the failure. If the node that received the request that initiated the overall storage process itself failed or otherwise is unavailable or unreachable by the data source, then a failure of the request may be inferred by the data source when no response is received from the node after a pre-determined period of time.

Figure 11:
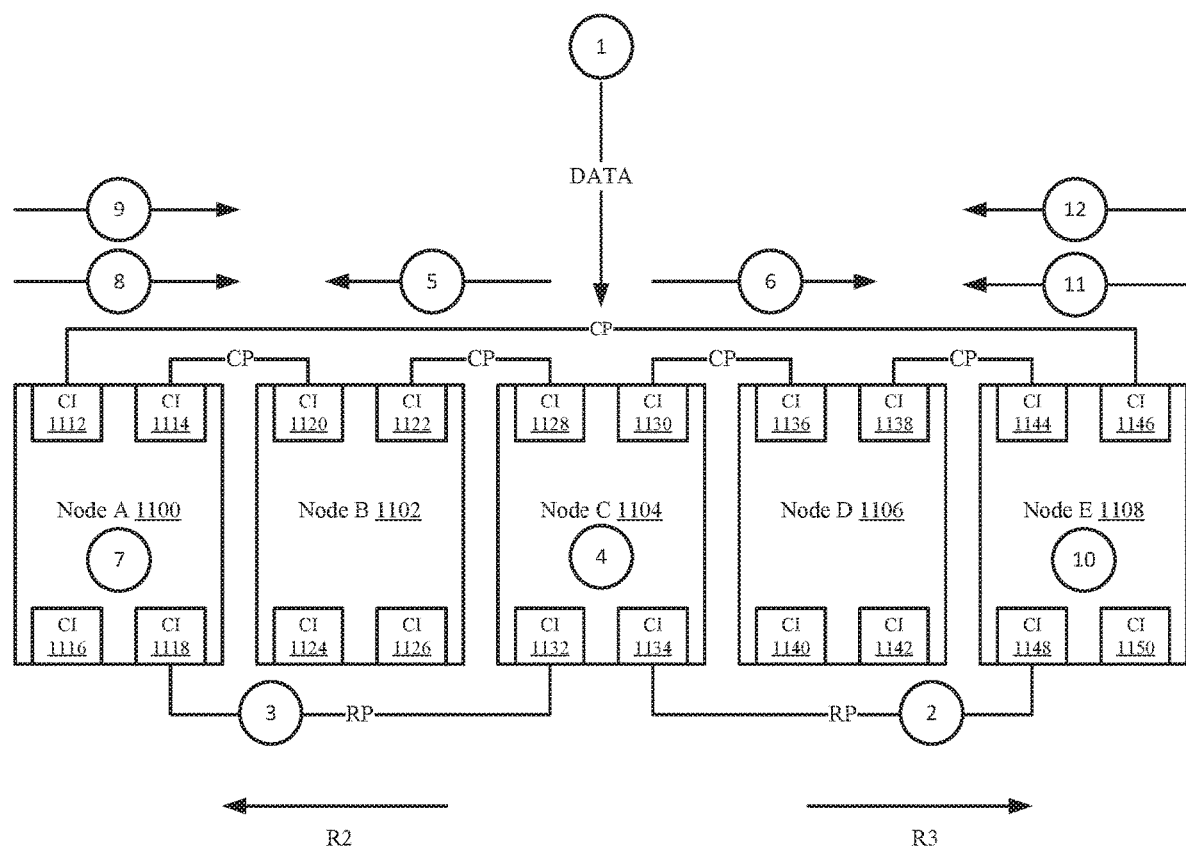
FIG. 11 shows a diagram of an example of storing data in nodes in accordance with one or more embodiments of the invention.

While FIGS. 10.1-10.2 describe different nodes performing the chunking of the data or the replicas, in another embodiment of the invention, the node that receives the initial request to store the data (e.g., FIG. 11, Node C (1104)) performs the chunking of the data and then distributes (via the replica path) the full set of chunks (i.e., the chunks that represent the data to be stored) to the replica targets. In this scenario, the replica targets then distribute the received data chunks as described above. This embodiment results in the only node that received the original request incurring the overhead associated with the chunking.

FIG. 11 shows a diagram of an example of storing data in nodes in accordance with one or more embodiments of the invention. The example is not intended to limit the scope of the invention.

Turning to the example, consider a scenario in which there are five nodes (Node A (1100), Node B (1102), Node C (1104), Node C (1106), and Node E (1108). The nodes are connected in a dual-chain configuration using communication interfaces (1112, 1114, 1116, 1118, 1120, 1122, 1124, 1126, 1128, 1130, 1132, 1134, 1136, 1138, 1140, 1142, 1144, 1146, 1148, and 1150); however, for the sake of clarity in FIG. 11 some of the physical connections between the various nodes are omitted. Continuing with the example, each of the nodes includes functionality to perform the method shown in FIGS. 10.1-10.2.

Consider a scenario in which a client (not shown) sends a request to Node C (1104) to store data and the request specifies that a total of three copies of the data need to be stored in the cluster [1]. The node-specific DPD information in Node C (1104) specifies the following: (i) replica path (RP) [Node A, Node C, Node E] and (ii) chunk paths (CP) [Node B] and [Node D]. Node C (1104) uses the replica path to determine that a replica needs to be sent to each of Nodes A (1100) and E (1108). Node C (1104) issues a request via the replica path to Node A (1100) [2] and issues a request via a second portion of the replica path to Node E (1108) [3]. In addition, Node C (1104) also chunks the DATA it received into data chunks and store a portion of the data chunks in its persistent storage [4]. A first portion of the remaining data chunks are transmitted to Node B (1102) via a chunk path [5] and a second portion of the remaining data chunks are transmitted to Node D (1106) via a second chunk path [6]. Though not shown in FIG. 11, Nodes B (1102) and D (1106) successfully store their respective portions of the data chunks and send back corresponding success notifications to Node C (1104) (e.g., via the chunk paths).

Node A (1100) receives the request from Node C (1104) via the replica path. Node A (1100) chunks the REPLICA 1 (which is a copy of DATA) it received into data chunks and store a portion of the data chunks in its persistent storage [7]. A first portion of the remaining data chunks are transmitted to Node B (1102) via a chunk path [8] and a second portion of the remaining data chunks are transmitted to Node E (1108) via a second chunk path [9]. Though not shown in FIG. 11, Nodes B (1102) and E (1108) successfully store their respective portions of the data chunks and send back corresponding success notifications to Node A (1100) (e.g., via the chunk paths). Upon receiving success notifications from Nodes B (1102) and E (1108), Node A sends a success notification to Node C (1104) indicating that REPLICA 1 was successfully stored.

Node E (1108) receives the request from Node C (1104) via the replica path. Node E (1108) chunks the REPLICA 2 (which is a copy of DATA) it received into data chunks and store a portion of the data chunks in its persistent storage [10]. A first portion of the remaining data chunks are transmitted to Node D (1106) via a chunk path [11] and a second portion of the remaining data chunks are transmitted to Node A (1100) via a second chunk path [12]. Though not shown in FIG. 11, Nodes A (1100) and D (1106) successfully store their respective portions of the data chunks and send back corresponding success notifications to Node E (1108) (e.g., via the chunk paths). Upon receiving success notifications from Nodes A (1100) and D (1106), Node E (1108) sends a success notification to Node C (1104) indicating that REPLICA 2 was successfully stored.

Finally, Node C (1104) upon receiving the success notifications from Nodes A (1100) and E (1108) and also after determining that DATA (which is chunked) has been successfully stored in Nodes B (1102), C (1104), and D (1106), sends a success notification to the client indicating that the DATA and two replicas were successfully stored in the cluster.

Figure 12:
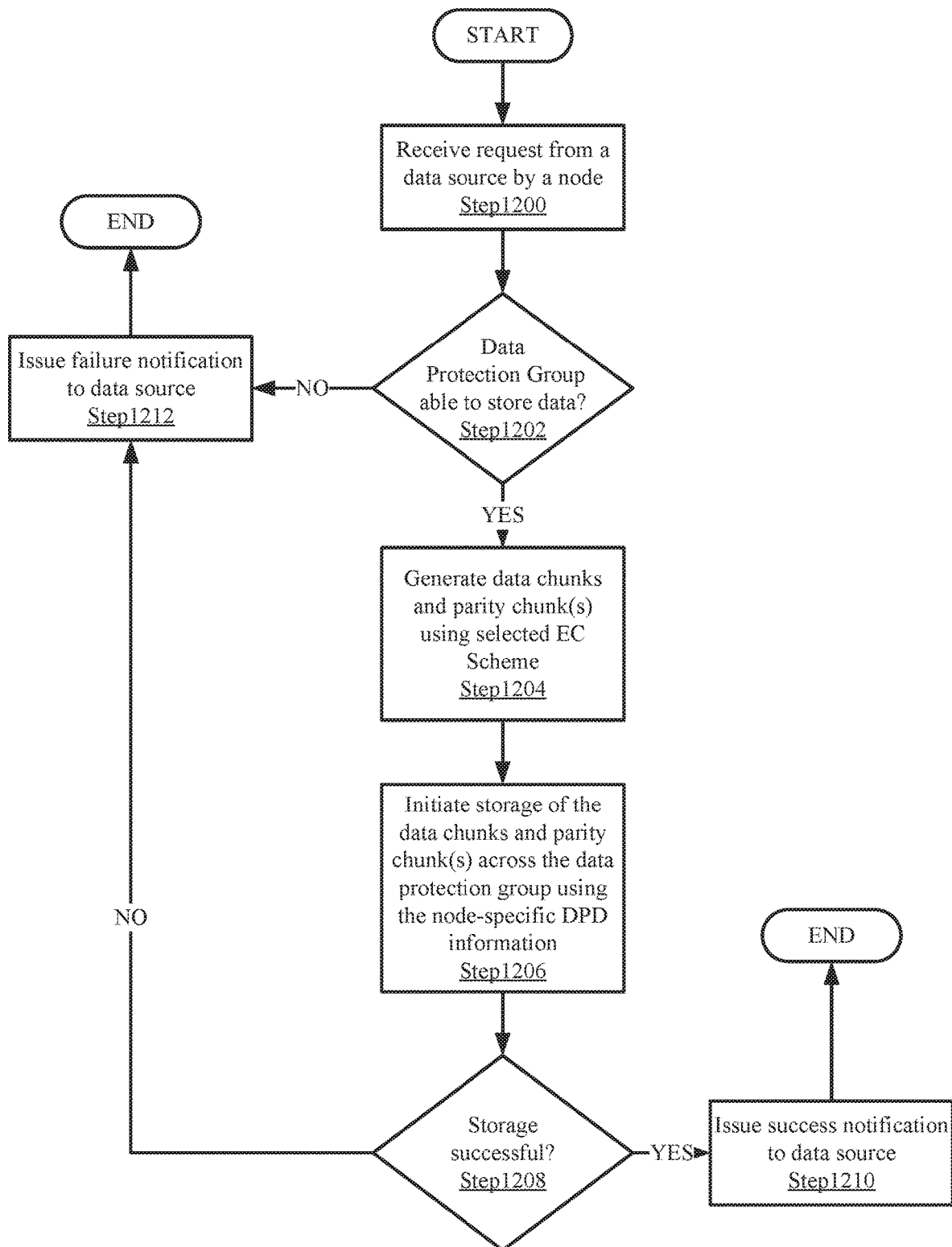
FIG. 12 shows a flowchart of a method of storing data in nodes in accordance with one or more embodiments of the invention.

FIG. 12 shows a flowchart of a method of storing data in nodes in accordance with one or more embodiments of the invention. Further, the method shown in FIG. 12 may be performed by the node management engine (or another component) in the node.

While FIG. 12 is illustrated as a series of steps, any of the steps may be omitted, performed in a different order, additional steps may be included, and/or any or all of the steps may be performed in a parallel and/or partially overlapping manner without departing from the invention.

In Step 1200, the data source may be a client, a data processor, and/or an application executing on a node. There may be other data sources without departing from the invention. The data source may or may not have aggregated DPD information.

In Step 1202, a determination is made about whether the DPG is able to store the data. If the DPG is able to store the data, then the process proceeds to step 1204; otherwise, the process proceeds to step 1212.

The determination in step 1202 may include determining whether: (i) the node that received the request can itself store the data and/or (ii) whether there are a sufficient number of nodes in the cluster. With respect to (i), this determination covers the scenario in which the node that received the request has itself failed, is unable to store data in its persistent storage, and/or is unable to facilitate the storage of data in the cluster. With respect to (ii), this determination covers whether there are a sufficient number of members in the cluster to service the request. This determination is made using the node-specific DPD information for one or more nodes (depending on the erasure coding scheme and the daisy chain configuration).

For example, if the data is to be stored using a particular erasure coding scheme (which may or may not be specified in the request), then the node-specific DPD information is used to determine whether there are a sufficient number of nodes to store the data (which is divided into data chunks) and parity value(s) (which may be stored in one or more parity chunks) in a manner that satisfies the erasure coding scheme.

For example, if the data is to be stored using a 3:1 erasure coding scheme. Then the cluster needs to include at least four nodes—three nodes to store the data chunks and one node to store the parity chunk. If the nodes are arranged in a single-chain configuration then the node-specific DPD information for at least two nodes is required to make this determination as the DPG for any given node in the cluster only includes three nodes. However, if the nodes are arranged in a dual-chain configuration then only node-specific DPD information from a single node in the cluster may be required as the DPG for each node in the cluster includes five nodes.

The determination in (ii) may be done on a per-request basis based on information specified in the request about the erasure coding scheme to be used to store the data. If the request does not specify any erasure coding scheme, then a default erasure coding scheme (e.g., as specified in the DPD information and/or elsewhere in the node) may be used to determine the minimum number of nodes required to store the data. In another embodiment of the invention, the default erasure coding scheme may be used even in scenarios in which the request specifies an erasure coding scheme. Specifically, if the cluster is unable to support the requested erasure encoding scheme, then the cluster may still store the data using a supported erasure coding scheme (i.e., an erasure encoding scheme for which the cluster includes a sufficient number of nodes).

Once the erasure coding scheme is determined, the number of nodes required to store the data may be determined and then this information may be used to make the determination in (ii).

In Step 1204, the data is divided into data chunks (which are the same size or substantially similar in size) and the corresponding parity value(s) is generated based on the selected erasure coding scheme (i.e., the erasure coding scheme that was used to make the determination in Step 1202). The generated parity value(s) is then stored in a parity chunk. If multiple parity values are generated, then one parity value is stored in each parity chunk.

In Step 1206, storage of the data chunks and parity chunks is initiated using the node-specific DPD information from one or more nodes (as discussed above). In a single-chain configuration, the data chunks are distributed across the node (i.e., the node that received the request in step 1200) and its two immediate neighbors. The parity chunks are then stored two hops away from the node (i.e., the node that received the request in step 1200). If there are multiple parity values, then they are stored across the nodes that are two hops away from the node (i.e., the node that received the request in step 1200).

In a dual-chain configuration, the data chunks and the parity chunks are distributed across the node (i.e., the node that received the request in step 1200) and the four immediate neighbor nodes.

Regardless of the daisy chain configuration, the data chunks and parity chunks for any given slice are each stored in separate nodes. For example, if File 1 is to be stored using a 3:1 erasure coding scheme, then File 1 may be divided into data chunks [A, B, C] and a parity value P1 may be generated using data chunks [A, B, C]. The resulting slice will include [A, B, C, P1], where each of the A, B, C, and P1 is stored on different nodes (as described above) based on the daisy chain configuration of the nodes.

Once the placement of the data chunks and parity chunk (s) is determined by the node (i.e., the node that received the request in step 1200), the node issues requests to store data chunks and parity chunks to the various nodes in the cluster. In addition, the node (i.e., the node that received the request in step 1200) stores a data chunk and/or a parity chunk in its persistent storage.

In Step 1208, a determination is made about whether the data storage in the DPG was successful. If the data storage was successful, then the process proceeds to step 1210; otherwise, the process proceeds to step 1212.

The determination in step 1208 may include: (i) determining whether the storage of the data chunk or parity chunk on the node was successful and (ii) whether the data chunk or parity chunk was successfully stored on each of the selected nodes in the cluster. With respect to (ii), the selected nodes may send a success or failure notification to the node via the physical paths that connect (directly or indirectly) the node to the selected nodes. The node may send a success notification when the data chunk or parity chunk is successfully stored on the node. The node may send a failure notification if the selected node is unable to store the data chunk or parity chunk in its persistent storage. In another embodiment of the invention, a failure may be determined to have occurred when no response is received from a node after the request is sent. This scenario may occur if, after the request is sent, the node subsequently fails or otherwise become unavailable or unreachable. Depending on the circumstances that give rise to a failure notification, the failure notification may include information about the cause of the failure.

In Step 1210, when the determination in step 1208 indicates successful storage of the data in the cluster, then a success notification is sent to the data source.

In Step 1212, when the determination in step 1202 indicates that the cluster is unable to store the data or the determination in step 1208 indicates that the storage of the data in the cluster was not successful, then a failure notification is sent to the data source. Depending on the circumstances that give rise to a failure notification, the failure notification may include information about the cause of the failure. If the node to which the request in step 1200 itself failed or otherwise is unavailable or unreachable by the data source, then a failure of the request may be inferred by the data source when no response is received from the node after a pre-determined period of time.

Figure 13:
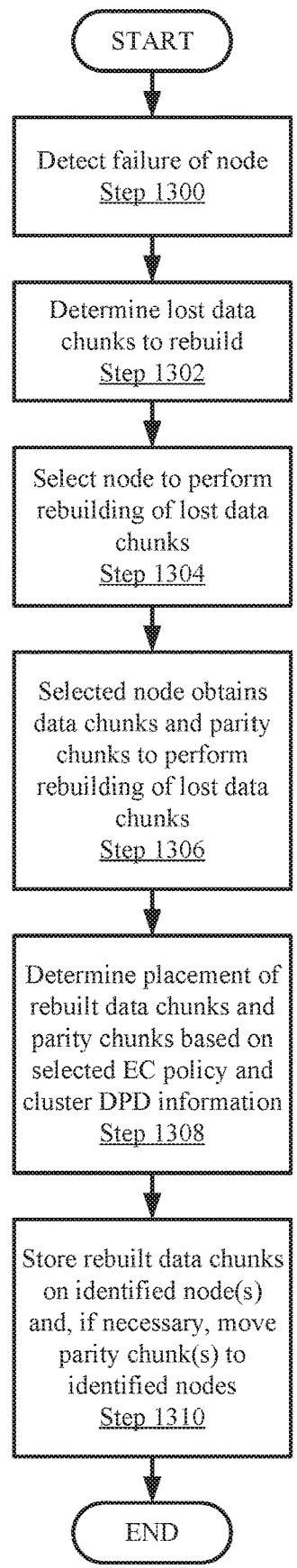
FIG. 13 shows a flowchart of a method of rebuilding data in nodes in accordance with one or more embodiments of the invention.

FIG. 13 shows a flowchart of a method of rebuilding data in nodes in accordance with one or more embodiments of the invention. Further, the method shown in FIG. 13 may be performed by the node management engine (or another component) in the node.

While FIG. 13 is illustrated as a series of steps, any of the steps may be omitted, performed in a different order, additional steps may be included, and/or any or all of the steps may be performed in a parallel and/or partially overlapping manner without departing from the invention.

In Step 1300, the node may detect that another node in the cluster has failed. The node may detect the failure of an immediate neighbor in response to monitoring its immediate neighbors and detecting a neighbor state change (see e.g., FIG. 5). Alternatively, or additionally, the node may detect a failure of non-immediate neighbor nodes by receiving node-specific DPD information for other nodes in the cluster. Alternatively, or additionally, the node may detect the failure of a node (which may or may not be an immediate neighbor) based on information received from a client, data processor, or any other external entity.

In Step 1302, in response to detecting the failure in step 1300, the node determines what data chunks have been lost. The node may make this determination using information about slices stored in the cluster. For example, each node may include information about all of the slices stored in the cluster, where the information includes the data chunks and parity chunks associated with each slice and the location of each of the aforementioned data chunks and parity chunks in the cluster. Alternatively, or additionally, the node may request information from an external entity (e.g., a client, a data processor, etc.) about what data chunks were stored on the failed node as well as information about the slices of which the lost data chunks were members. Alternatively, or additionally, the node may request information about the lost data chunks and/information about the slices stored in the cluster from other nodes in the cluster.

Regardless of how information about the slices is obtained, the result of step 1302 is: (i) identification of the data chunks that are lost and (ii) identification of the location of the data chunks and parity chunks that may be used to rebuild the lost data chunks.

In Step 1304, a node (which may or may not be the node that detected the failure) in the cluster is selected to perform the rebuilding of the lost data chunks. The selection of the node is based on node-specific DPD information and/or aggregated DPD information (which may be stored on one or more nodes in the cluster). The use of the aforementioned DPD information enables selection of the node that minimizes: (i) the number of data chunks and/or parity chunks that need to be transmitted for the rebuilding process and/or (ii) minimizes the distance (in this context the number of hops) over which the data chunks and/or parity chunks have to be transmitted. For example, a node that is one hop to (i.e., is an immediate neighbor of) most of the other nodes that include the data chunks and parity chunks required for rebuilding the lost data chunks may be selected over a node for which most of the required data chunks and/or parity chunks are two-hops from the node.

At the end of step 1304, the selected node is notified that it is to initiate the rebuilding of the lost data chunks. The selected node, as part of the notification, may also receive with information required to enable it to rebuild the lost data chunks such as information about the data chunks and parity chunks required to perform the rebuilding of the lost data chunks as well as the location of aforementioned required chunks.

In Step 1306, the selected node obtains the required data and parity chunks from the respective nodes in the cluster. The selected node may obtain such information by sending requests to each of the nodes that includes a required data chunk or parity chunk. The selected node, upon receiving the data chunks and parity chunks, rebuilds the lost data chunks using any known or later discovered rebuilding mechanism that uses parity data.

In Step 1308, the selected node determines the placement of the rebuilt data chunks and the placement of the parity chunks. The placement may be made using the erasure coding scheme as well as the DPD information (which may be node-specific DPD information or aggregated DPD information). The placement may be performed in manner that is the same or substantially similar to the placement described in Step 1206. The placement performed in step 1308 may also take into account the current locations of the data chunks and parity chunks such that the ultimate placement determined in step 1308 minimizes: (i) re-location of data chunks and parity chunks and (ii) the re-location of data chunks or parity chunks between nodes that are not immediate neighbors.

In Step 1310, the selected node initiates the storage of the rebuilt data chunks and, if necessary, the re-location of one or more parity chunks.

While FIG. 13 focuses on rebuilding lost data chunks, the method in FIG. 13 may also be used to rebuild lost parity chunks.

While steps 1300-1304 are described as being performed by a node, these steps may be performed by an external entity, e.g., a SoFS, a data processor, a client. In such scenarios, after steps 1300-1304 are performed, the selected node is then provided with the information necessary to rebuild the lost data chunks and then store the data chunks and, if required, re-locate the parity chunks in the cluster.

FIGS. 14.1-14.3 show diagrams of an example of storing data and rebuilding data in nodes in accordance with one or more embodiments of the invention. The example is not intended to limit the scope of the invention.

Consider a scenario in which there are six nodes (Node A (1400), Node B (1402), Node C (1404), Node C (1406), Node E (1408), Node F (1410)) arranged in a single-chain configuration connected by communication interfaces (1412, 1414, 1416, 1418, 1420, 1422, 1424, 1426, 1428, 1430, 1432, 1434). In this example, a request to store DATA is received by Node B (1402) [1]. Node B (1402), in response to receiving the request, determines, using the node-specific DPD information, that the DATA is to be stored in a 3:1 erasure coding scheme.

Node B (1402) subsequently divides the DATA into the following chunks [A, B, C, D, E, F] and calculates two parity values P1 and P2. P1 is calculated using [A, B, C] and P2 is calculated using [D, E, F] [2]. Node B (1404), using aggregated DPD information (i.e., node-specific DPD information from a number of different nodes) determines the location of each of the aforementioned data and parity chunks (i.e., the parity chunks that store P1 and P2).

In this example, the data chunks are distributed across Node B (1402) and its immediate neighbor nodes (i.e., Node A (1400) and Node C (1404)) with the constraint (based on the erasure coding scheme) that no two chunks of a slice can be stored on the node. For example, for slice [A, B, C, P1], each of the aforementioned chunks must be stored on a different node. Further, while the data chunks are stored on immediate neighbors, the parity chunks can be stored on nodes that are directly connected to the immediate neighbors. This enables DATA to be more easily read from the cluster as all the data chunks for a given slice are stored on a node or its immediate neighbors.

Once Node B determines the placement of each data chunk and parity chunk, Node B issues the corresponding request via the communication interfaces to the other nodes in the cluster. This results in Node A (1400) storing [B, E], Node B (1402) storing [A, D], Node C (1404) storing [C, F], Node D (1406) storing [P1], and Node F (1410) storing [P2] [3].

Referring to FIGS. 14.2 and 14.3, after the aforementioned data chunks and parity chunks are stored, Node C (1404) fails. In response to the failure, Node A is identified as the node that will rebuild data chunks C and F. The selection of Node A may be performed in accordance with FIG. 13. Node A (1400) subsequently requests data chunks [A, D] from Node B (1402), parity chunk [P1] from Node D (1406), and parity chunk [P2] from Node F (1410). All of the requests may be made by the appropriate communication interfaces, which may be determined using the node-specific DPD information from one or more nodes. Node A subsequently rebuilds data chunk $[C_r]$ and data chunk $[F_r]$ and then determines where to place the rebuilt data chunks and whether to re-locate the parity chunks. The placement of the data chunks is first considered in order to have data chunk $[C_r]$ and data chunk $[F_r]$ on an immediate neighbor node of Node A (1400) without violating the rule that a give node cannot have more than one chunk from a given slice. Accordingly, in this example, Node A (1400) determines that data chunk $[C_r]$ and data chunk $[F_r]$ should be place on Node F (1410) and sends data chunk $[C_r]$ and data chunk $[F_r]$ to Node F (1410) [5].

However, because Node F (1410) previously stored parity chunk [P2], Node A (1400) also requests that Node F (1410) transmit a copy of [P2] to Node E (1408) and remove the copy of [P2] from Node F (1410) [7]. Finally, Node A (1400) determines that [P1] needs to be relocated because Node D (1406) is more than two hops away from Node A (i.e., it is not directly connected to an immediate neighbor of Node A). Accordingly, Node A (1400) requests that Node D (1406) transmit a copy of [P1] to Node E (1408) and remove the copy of [P1] from Node D (1406) [8]. All of the aforementioned communications may be transmitted between the nodes using the node-specific DPD information from one or more nodes. The result of the aforementioned rebuilding of data chunk [C$_r$] and data chunk [F$_r$] and the relocation of the parity chunks is shown in FIG. 14.3.

Figure 15:
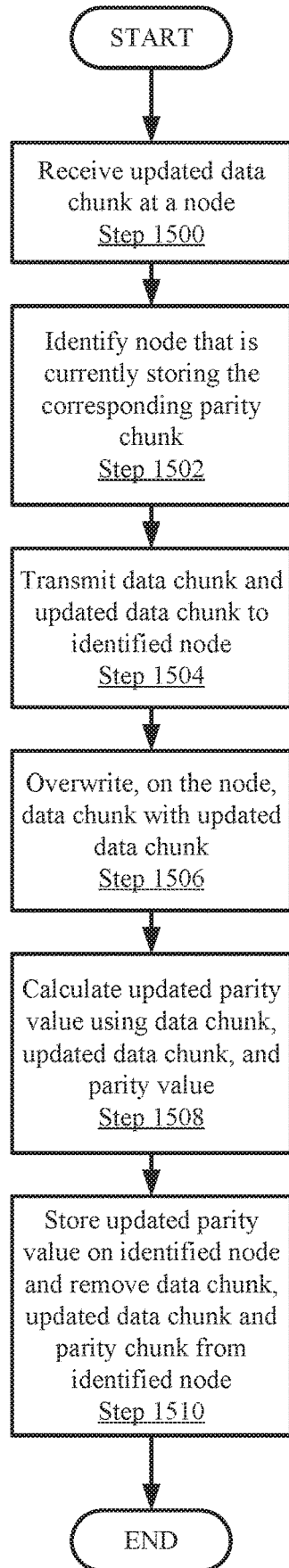
FIG. 15 shows a flowchart of a method of storing data in nodes in accordance with one or more embodiments of the invention.

FIG. 15 shows a flowchart of a method of storing data in nodes in accordance with one or more embodiments of the invention. Further, the method shown in FIG. 15 may be performed by the node management engine (or another component) in the node.

The method shown in FIG. 15 relates to storing an update to erasure coded data in a manner that limits the transmission of data chunks and parity chunks between nodes in the cluster while still maintaining the data protection provided by the erasure code scheme.

While FIG. 15 is illustrated as a series of steps, any of the steps may be omitted, performed in a different order, additional steps may be included, and/or any or all of the steps may be performed in a parallel and/or partially overlapping manner without departing from the invention.

In Step 1500, an updated data chunk is received by a node. The node that received the updated data chunk is currently also storing the data chunk (i.e., the corresponding previous version of the data chunk). The updated data chunk may be received from an external entity (e.g., a data processor, a SoFS, a client, etc.) that is: (i) aware of the location of the data chunks in the cluster and (ii) is able to determine that the updated data chunk corresponds to a previous version of the data chunk currently stored on the node.

In Step 1502, the node that is currently storing the corresponding parity chunk is identified. More specifically, the updated data chunk received in step 1500 is part of a slice, where the slice includes data chunks and at least one parity chunk. Thus, the node identified in step 1502 corresponds to the node that is storing the parity chunk that is part of the same slice as the previous version of the data chunk, which the updated data chunk is replacing.

The node that received the updated data chunk may identify the node storing the corresponding parity chunk using information about slices stored in the cluster. For example, each node may include information about all of the slices stored in the cluster, where the information includes the data chunks and parity chunks associated with each slice and the location of each of the aforementioned data chunks and parity chunks in the cluster. Alternatively, or additionally, the node may request information from an external entity (e.g., a SoFS, a client, a data processor, etc.) about the node that is currently storing the corresponding parity chunk. Alternatively, or additionally, the node may request information about the node that is currently storing the corresponding parity chunk from other nodes in the cluster. The requests to the other nodes may be sent using node-specific DPD information.

In Step 1504, the updated data chunk and the previous version of the data chunk are transmitted to the node identified in step 1502. The transmission of the updated data chunk and the previous version of the data chunk may be performed using the DPD information (which may be node-specific DPD information or aggregated DPD information) in order to minimize the number of hops the updated data chunk and the previous version of the data chunk must make prior to reaching the identified node.

In Step 1506, the previous version of the data chunk is over written with the updated data chunk. Step 1506 is performed on the node that originally received the updated data chunk.

In Step 1508, the identified node that received the updated data chunk and the previous version of the data chunk generates an updated parity chunk using the updated data chunk, the previous version of the data chunk, and the parity value currently stored in the identified node.

In Step 1510, the updated parity chunk (which includes the updated parity value generated in step 1508) is stored in the identified node. Further, the updated data chunk, the previous version of the data chunk, and the previous parity chunk (i.e., the parity chunk previously stored on the identified node) are deleted.

FIGS. 16.1-16.3 show diagrams of an example of storing data in nodes in accordance with one or more embodiments of the invention. The invention is not intended to limit the scope of the invention.

Turning to the example, consider a scenario in which there are six nodes (Node A (1600), Node B (1602), Node C (1604), Node C (1606), Node E (1608), Node F (1610)) arranged in a single-chain configuration using communication interfaces (CIs) (1612, 1614, 1616, 1618, 1620, 1622, 1624, 1626, 1628, 1630, 1632, and 1634).

In this scenario, Node B (1602) receives an updated data chunk [A'][1]. In order to maintain the erasure coding scheme, the parity value [P1] needs to be updated as data chunk [A] has been updated to data chunk [A']. If the parity value is not updated, then the slice that includes data chunks [A', B, C] is not protected by the erasure coding scheme. Accordingly, Node B (1602) subsequently determines, using the method described in FIG. 15, that Node D (1606) includes the corresponding parity chunk [P1].

Node B (1602), using the node-specific DPD information from one or more nodes, sends a copy of data chunks [A] and [A'] to Node D (1606) [2]. Data chunks [A] and [A'] may be sent as a single write, where the size of the data transferred during the write is sufficient to enable data chunks [A] and [A'] to be transferred together. Node B (1602) subsequently deletes (or removes) its copy of data chunk [A] [3]. Finally, Node D (1606) calculates the updated parity chunk [P1'] using data chunk [A], data chunk [A'], and parity chunk [P1]. The updated parity chunk [P1'] is stored in Node D (1606) and copies of data chunk [A], data chunk [A'], and parity chunk [P1] are deleted (or removed) from Node D [4].

The example shown in FIGS. 16.1-16.3 may reduce the number of reads and writes required to generate a new parity chunk. Specifically, the example shown in FIGS. 16.1-16.3 only requires a single write of data chunks [A] and [A'] to Node D and then a single write of the updated parity chunk to the node that calculated the parity chunk (e.g., storing the updated parity chunk in persistent storage on the node), where the writing of the updating parity chunk [P1] does not require [P1'] to be transferred to another node. Prior approaches to update the parity chunk typically included obtaining data chunks [B] and [C] by Node B (1602), which then calculates the updated parity chunk [P1']. The updated parity chunk [P1'] would then be written to Node D (1606). Thus, the traditional approach to calculating and storing an updated parity chunk [P1'] required obtaining (e.g., reading) to data chunks for other nodes and writing the updated parity chunk to another node as compared to one write in the method shown in FIGS. 16.1-16.3. Said another way, the traditional approach required two data chunks and one updated parity chunk to be separately transmitted between nodes while various embodiments of the method shown in FIGS. 16.1-16.3 only require a single combined transmission of two data chunks.

Figure 17:
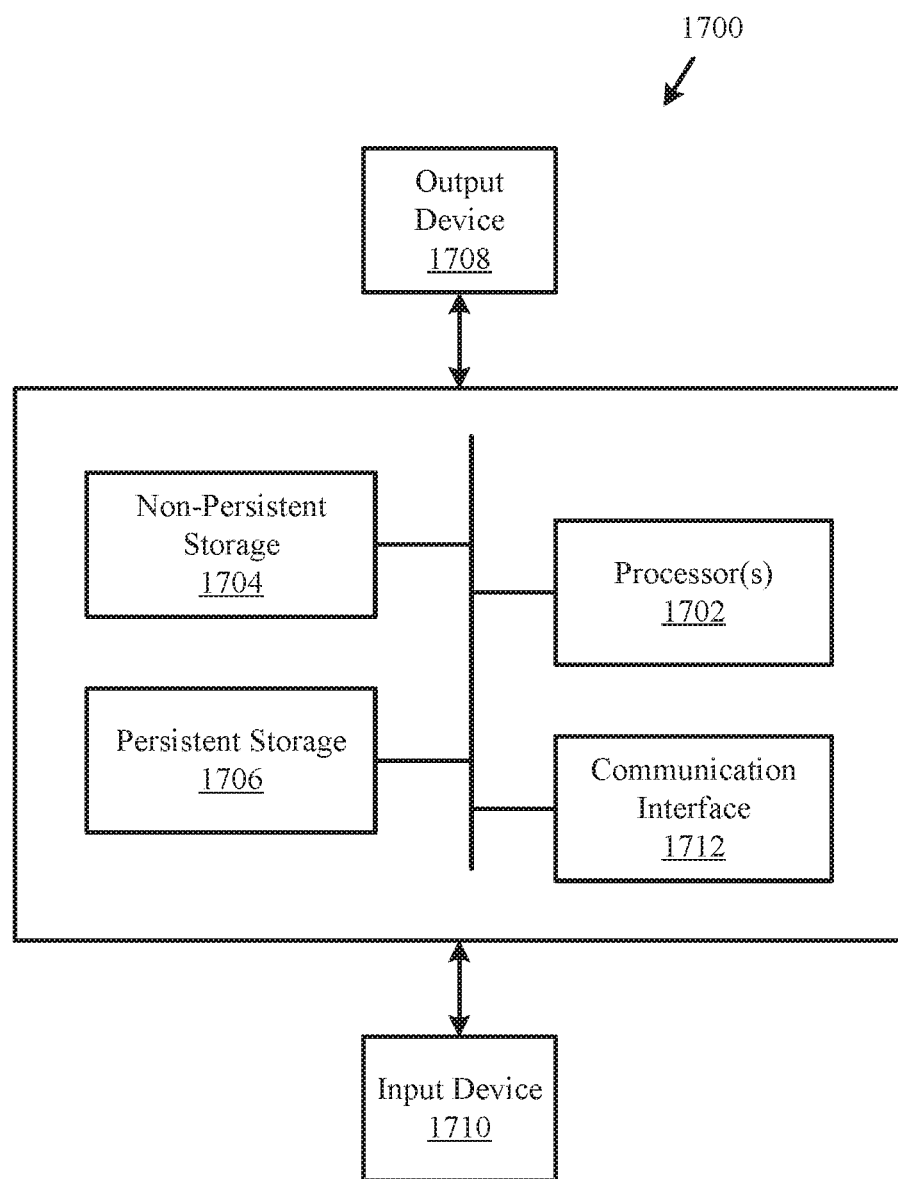
FIG. 17 shows a diagram of a computing device in accordance with one or more embodiments of the invention.

As discussed above, embodiments of the invention may be implemented using computing devices. FIG. 17 shows a diagram of a computing device in accordance with one or more embodiments of the invention. The computing device (1700) may include one or more computer processors (1702), non-persistent storage (1704) (e.g., volatile memory, such as random access memory (RAM), cache memory), persistent storage (1706) (e.g., a hard disk, an optical drive such as a compact disk (CD) drive or digital versatile disk (DVD) drive, a flash memory, etc.), a communication interface (1712) (e.g., Bluetooth interface, infrared interface, network interface, optical interface, etc.), input devices (1710), output devices (1708), and numerous other elements (not shown) and functionalities. Each of these components is described below.

In one embodiment of the invention, the computer processor(s) (1702) may be an integrated circuit for processing instructions. For example, the computer processor(s) may be one or more cores or micro-cores of a processor. The computing device (1700) may also include one or more input devices (1710), such as a touchscreen, keyboard, mouse, microphone, touchpad, electronic pen, or any other type of input device. Further, the communication interface (1712) may include an integrated circuit for connecting the computing device (1700) to a network (not shown) (e.g., a local area network (LAN), a wide area network (WAN) such as the Internet, mobile network, or any other type of network) and/or to another device, such as another computing device.

In one embodiment of the invention, the computing device (1700) may include one or more output devices (1708), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1702), non-persistent storage (1704), and persistent storage (1706). Many different types of computing devices exist, and the aforementioned input and output device(s) may take other forms.

Embodiments of the invention may provide a computationally efficient method for managing data in a storage system. More specifically, embodiments of the invention may enable one or more of the following: (i) storage of data using dynamically updated node configuration information; (ii) dynamic implementation of various data protection schemes using dynamically updated node connectivity information; (iii) implementation of various data protection schemes at the node level without required external management of the nodes; (iv) placement of data in the nodes based on dynamically updated node connectivity information; and (v) efficient rebuilding and updating of data chunks and parity chunks.

Further, in one or more embodiments of the invention, by storing the data and replicas in the manner described in FIGS. 8-11, the reading of such data may also be improved. More specifically, by storing data chunks for a given replica (or copy of data) on a node and its immediate neighbors, the reading of such data (e.g., the reading of all of the data chunks that make up a file) only requires reading data chunks from a node or from its immediate neighbors. This reduces the amount of time required to retrieve the data chunks as the data chunks are at most one hop from the node that received the request. Further, in various embodiments of the invention, by physically separating the replica paths and the chunk paths, the data chunks may be obtained more efficiently from the immediate neighbors via the chunk paths.

Further, in one or more embodiments of the invention, by storing the erasure coded data in the manner described in FIGS. 12-14.3, the reading of such data may also be improved. More specifically, by storing data chunks for a slice on a node and its immediate neighbors, the reading of such data (e.g., the reading of all of the data chunks that make up the slice) only requires reading data chunks from a node or from its immediate neighbors. This reduces the amount of time required to retrieve the data chunks as the data chunks are at most one hop from the node that received the request. Further, if the node needs to rebuild a data chunk(s), then the close proximity of the data chunks that are required for the rebuilding of the lost data chunks reduces the amount of overhead required to retrieve the data chunks.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for storing data, comprising:
receiving, by a node, a request to store data from a data source;
dividing the data into a plurality of data chunks and generating a parity chunk using the plurality of data chunks based on an erasure coding scheme; and
storing the plurality of data chunks and the parity chunk across a plurality of nodes using data protection domain (DPD) information, wherein the node is one of the plurality of nodes,
wherein the DPD information specifies a plurality of immediate neighbor nodes of the node, and wherein each of the plurality of data chunks is stored in one of the plurality of immediate neighbor nodes.

2. The method of claim 1, wherein the parity chunk is stored on a second node that is directly connected to one of the plurality of immediate neighbor nodes.

3. The method of claim 1, wherein the parity chunk is stored on one of the plurality of immediate neighbor nodes.

4. The method of claim 1, wherein the DPD information specifies the erasure coding scheme and wherein the request does not specify any erasure coding scheme.

5. The method of claim 1,
wherein the request specifies a second erasure coding scheme;
wherein the method further comprises:
determining that the second erasure coding scheme is not supported by a cluster, wherein the node is a member of the cluster;
selecting in response to the determination, the erasure coding scheme.

6. The method of claim 5, wherein the determination that the second erasure coding scheme is not supported by the cluster is made using, at least in part, the DPD information.

7. The method of claim 1, further comprising:
receiving, by the node, a second request to store second data from the data source;
dividing the second data into a second plurality of data chunks and generating a second parity chunk using the second plurality of data chunks based on a second erasure coding scheme; and storing the second plurality of data chunks and the second parity chunk across the plurality of nodes using the data protection domain (DPD) information.

8. A non-transitory computer readable medium comprising computer readable program code, which when executed by a computer processor enables the computer processor to perform a method for storing data, a method comprising:

receiving, by a node, a request to store data from a data source;

dividing the data into a plurality of data chunks and generating a parity chunk using the plurality of data chunks based on an erasure coding scheme; and storing the plurality of data chunks and the parity chunk across a plurality of nodes using data protection domain (DPD) information, wherein the node is one of the plurality of nodes, wherein the DPD information specifies a plurality of immediate neighbor nodes of the node, and wherein each of the plurality of data chunks is stored in one of the plurality of immediate neighbor nodes.

9. The non-transitory computer readable medium of claim 8, wherein the parity chunk is stored on a second node that is directly connected to one of the plurality of immediate neighbor nodes.

10. The non-transitory computer readable medium of claim 8, wherein the parity chunk is stored on one of the plurality of immediate neighbor nodes.

11. The non-transitory computer readable medium of claim 8, wherein the DPD information specifies the erasure coding scheme and wherein the request does not specify any erasure coding scheme.

12. The non-transitory computer readable medium of claim 8, wherein the request specifies a second erasure coding scheme;

wherein the method further comprises:

determining that the second erasure coding scheme is not supported by a cluster, wherein the node is a member of the cluster;

selecting in response to the determination, the erasure coding scheme.

13. The non-transitory computer readable medium of claim 12, wherein the determination that the second erasure coding scheme is not supported by the cluster is made using, at least in part, the DPD information.

14. The non-transitory computer readable medium of claim 8, further comprising:

receiving, by the node, a second request to store second data from the data source;

dividing the second data into a second plurality of data chunks and generating a second parity chunk using the second plurality of data chunks based on a second erasure coding scheme; and storing the second plurality of data chunks and the second parity chunk across the plurality of nodes using the data protection domain (DPD) information.

15. A node, comprising:

a processor;

memory, comprising:

data protection domain (DPD) information, wherein the DPD information specifies a plurality of immediate neighbor nodes of the node; and instructions which when executed by the processor, enable the node to perform a method, the method comprising:

receiving a request to store data from a data source;

dividing the data into a plurality of data chunks and generating a parity chunk using the plurality of data chunks based on an erasure coding scheme; and storing the plurality of data chunks and the parity chunk across a plurality of nodes using the DPD information, wherein the node is one of the plurality of nodes, and wherein each of the plurality of data chunks is stored in one of the plurality of immediate neighbor nodes.

16. The node of claim 15, wherein the parity chunk is stored on a second node that is directly connected to one of the plurality of immediate neighbor nodes.

17. The node of claim 15, wherein the DPD information specifies the erasure coding scheme and wherein the request does not specify any erasure coding scheme.

* * * * *